US012670400B2

(12) United States Patent
Chakrabartty et al.

(10) Patent No.: US 12,670,400 B2
(45) Date of Patent: Jun. 30, 2026

(54) SYNAPTIC MEMORY AND MEMORY ARRAY USING FOWLER-NORDHEIM TIMERS

(71) Applicant: Washington University, St. Louis, MO (US)

(72) Inventors: Shantanu Chakrabartty, St. Louis, MO (US); Darshit Mehta, St. Louis, MO (US)

(73) Assignee: Washington University, St. Louis, MO (US)

( * ) Notice: Subject to any disclaimer, the term of this patent is extended or adjusted under 35 U.S.C. 154(b) by 732 days.

(21) Appl. No.: 18/042,230

(22) PCT Filed: Oct. 28, 2021

(86) PCT No.: PCT/US2021/056995
§ 371 (c)(1),
(2) Date: Feb. 20, 2023

(87) PCT Pub. No.: WO2022/094038
PCT Pub. Date: May 5, 2022

(65) Prior Publication Data
US 2023/0297838 A1 Sep. 21, 2023

Related U.S. Application Data

(60) Provisional application No. 63/202,075, filed on May 26, 2021, provisional application No. 63/198,578, filed on Oct. 28, 2020.

(51) Int. Cl.
*G06F 3/00* (2006.01)
*G06N 3/0464* (2023.01)
(Continued)

(52) U.S. Cl.
CPC .......... *G06N 3/084* (2013.01); *G06N 3/0464* (2023.01); *G11C 27/005* (2013.01)

(58) Field of Classification Search
None
See application file for complete search history.

(56) References Cited

U.S. PATENT DOCUMENTS 5,136,176 A 8/1992 Castro
6,144,581 A 11/2000 Diorio et al.
(Continued)

OTHER PUBLICATIONS

International Search Report and Written Opinion issued in International Application No. PCT/US2021/056995 mailed on Feb. 17, 2022; pp. 1-9.

*Primary Examiner* — Midys Rojas
(74) *Attorney, Agent, or Firm* — Armstrong Teasdale LLP

(57) ABSTRACT

An analog memory device includes a first node and a second node. The first node includes a first floating gate, a second floating gate, and a capacitor. The first node first floating gate is connected to the first node second floating gate via the capacitor. The second node includes a first floating gate, a second floating gate, and a capacitor. The second node first floating gate is connected to the second node second floating gate via the capacitor. The second node is connected to the first node, and an analog state of the first node and an analog state of the second node continuously and synchronously decay with respect to time.

16 Claims, 18 Drawing Sheets

(51) Int. Cl.
  G06N 3/084 (2023.01)
  G11C 27/00 (2006.01)

(56) References Cited

U.S. PATENT DOCUMENTS

| | | | |
|---|---|---|---|
| 7,700,994 B2 | 4/2010 | Roizin et al. | |
| 7,915,666 B2 | 3/2011 | Yasui et al. | |
| 8,102,007 B1 | 1/2012 | Hyde et al. | |
| 10,169,701 B2 | 1/2019 | Hosokawa et al. | |
| 10,446,234 B2 | 10/2019 | Chakrabartty et al. | |
| 10,672,471 B2 | 6/2020 | Ishii et al. | |
| 10,748,630 B2 | 8/2020 | Tran et al. | |
| 10,797,236 B2 | 10/2020 | Park et al. | |
| 2015/0221661 A1 | 8/2015 | Milani et al. | |
| 2019/0318232 A1 | 10/2019 | Cruz-Albrecht et al. | |
| 2020/0202202 A1 | 6/2020 | Chava et al. | |
| 2020/0311524 A1 | 10/2020 | Van Dal et al. | |
| 2024/0212753 A1* | 6/2024 | Zhang | H10B 43/40 |

\* cited by examiner

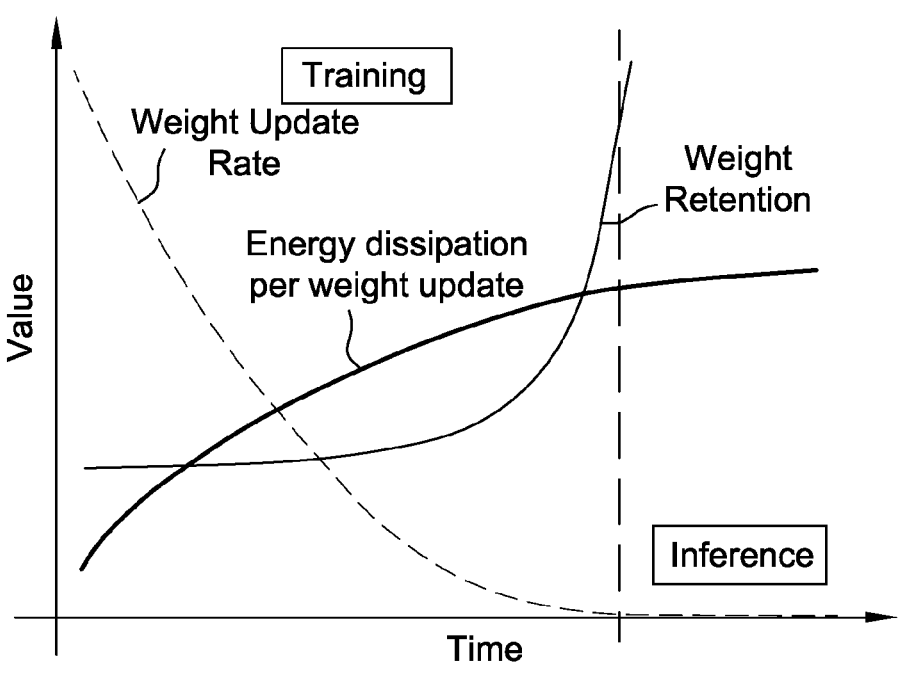
FIG. 12
FIG. 13A
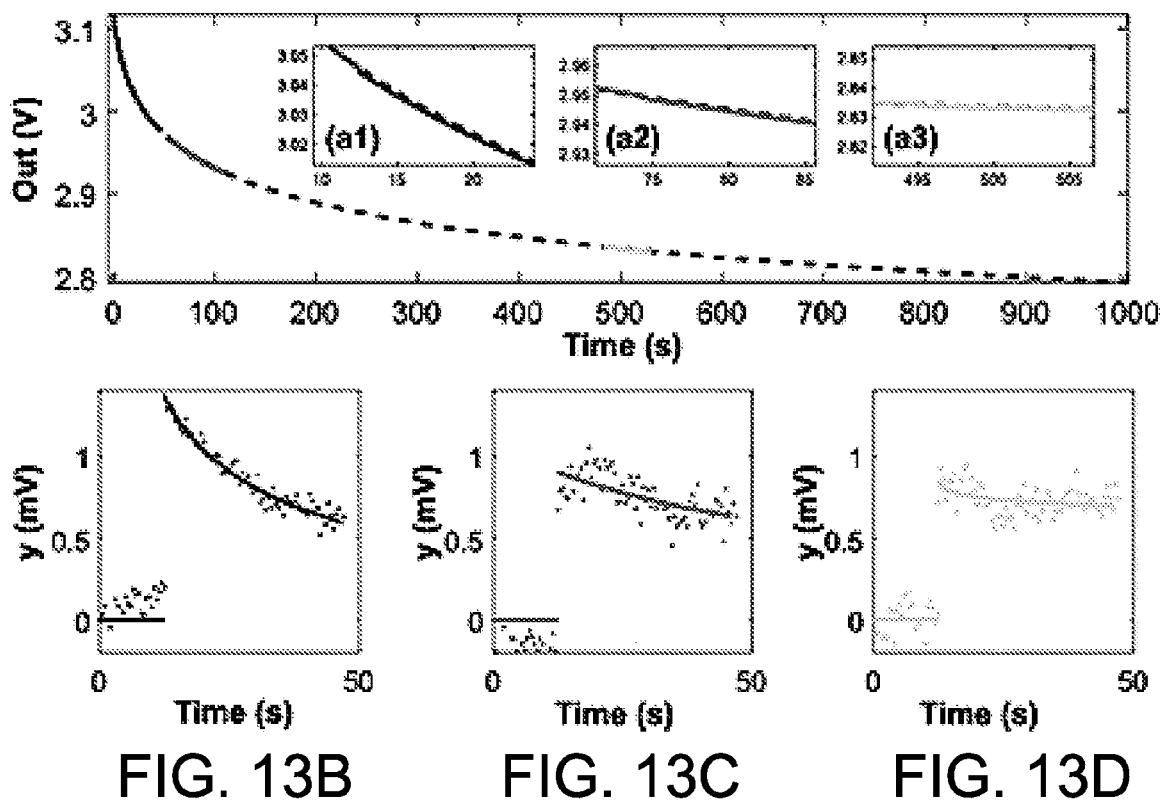
Dynamic analog memory with an asymptotic non-volatile storage
FIG. 13B          FIG. 13C          FIG. 13D

- SET INPUT

- RESET INPUT

- SET INPUT

SYNAPTIC MEMORY AND MEMORY ARRAY USING FOWLER-NORDHEIM TIMERS

CROSS-REFERENCE TO RELATED APPLICATION

This application is a National Phase Application of PCT/US2021/056995 filed on Oct. 28, 2021, which claims priority to U.S. Provisional Patent Application Ser. No. 63/198,578, filed Oct. 28, 2020, U.S. Provisional Patent Application Ser. No. 63/202,075, filed May 26, 2021, the entire disclosures of which are hereby incorporated by reference in their entireties.

STATEMENT REGARDING FEDERALLY SPONSORED RESEARCH & DEVELOPMENT

This invention was made with government support under EY028362 awarded by the National Institutes of Health, ECCS1935073 awarded by the National Science Foundation, N00014-16-1-2426 and N00014-19-1-2049 awarded by the Office of Naval Research. The government has certain rights in the invention.

FIELD

The field of the present disclosure relates generally to analog memory devices, and more particularly, to analog memory devices which utilize Fowler-Nordheim (FN) tunneling to achieve an adaptive synaptic array for dynamic analog memory (DAM).

BACKGROUND

Implementation of reliable and scalable synaptic memory has been one of the challenges in the design of energy-efficient neuromorphic processors. Synapses can be viewed as an analog memory with very long retention times (hours, days, and years) and operate at ultra-low-energy budgets to switch between different memory states (equivalent to memory read/write operations). While some of the emerging memories like memristors have been used to implement synapses, and for in-memory computing elements, the current state-of-the-art memristor can only be programmed at a limited resolution, and exhibits high device-to-device variability. Also, in memristor based neuromorphic designs, the system complexity arises due to heterogenous integration of memristor crossbar arrays into CMOS which sometimes requires an elaborate addressing and programming mechanisms. Other types of non-volatile memories like resistor random-access memories (RRAM), magnetic random-access memories (MRAM) could also be used to implement memristor, however, they also face integration challenges with mainstream CMOS technology, thus incurring high fabrication costs. Also, these FN-DAMs have limited programming resolution or have a high write/erase energy-budget. In this regard, analog floating-gates can serve as ideal candidate for implementing synaptic memories in neuromorphic processors because they can be directly integrated within the CMOS neural circuitry. However, analog floating-gates like FLASH memories require high-voltage charge pumps for precision programming. As a result, the energy requirements to write and erase the contents of the analog floating-gate memory is significantly larger than that of memristors, RRAMs and MRAMs.

Further, implementation of reliable and scalable synaptic weights or memory remains an unsolved challenge in the design of energy-efficient machine learning (ML) and neuromorphic processors. Ideally, the synaptic weights should be "analog" and should be implemented on a non-volatile, easily modifiable storage device. Furthermore, if these memory elements are integrated in proximity with the computing circuits or processing elements, then the resulting compute-in-memory (CIM) architecture has the potential to mitigate the "memory wall" which refers to the energy-efficiency bottleneck in ML processors that arises due to repeated memory access. In most practical and scalable implementations, the processing elements are implemented using CMOS circuits; as a result, it is desirable that the analog synaptic weights be implemented using a CMOS-compatible technology. A learning/training algorithm that adapts its weights in quantized steps towards a target solution, must dissipate energy for memory updates.

SUMMARY

In one aspect, an analog memory device is provided. The memory device includes two nodes: one node defines a SET function and the other node defines a RESET function. Each node includes two floating gates connected by a capacitor. The first gate serves as a tunneling gate and the second gate serves as a readout gate. A charge may be selectively applied to the floating gates which alters the shape of the energy barrier and allows for FN tunneling. The analog state of the first node and the analog state of the second node continuously and synchronously decay with respect to time.

In another aspect, an adaptive synaptic array is comprised of a plurality of analog memory devices driven by Fowler-Nordheim quantum tunneling. Each analog memory device includes a first node and a second node. Each node contains a first and second floating gate, coupled by a capacitor. The first node serves as a SET function and is connected to the second node, which serves a RESET function.

In yet another aspect, a method for machine learning is implemented by utilizing a plurality of analog memory devices driven by Fowler-Nordheim quantum tunneling. In this method, the FN-DAM device acts as a non-volatile memory. One of a plurality of FN-DAM devices is used to store a point in a set of data, a model is selected corresponding to a task associated with the set of data, and the data is evaluated against the model and tuning is applied to each parameter to improve future performance. Predictions are made about future performance based on the tuned parameters and the process is repeated to improve accuracy.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 12 is a graph of the analog synapse characteristic during training and inference.

FIGS. 13A-13D are a set of graphs that plot of the voltage vs. time response under three different operating conditions.

Unless otherwise indicated, the drawings provided herein are meant to illustrate features of embodiments of the disclosure. These features are believed to be applicable in a wide variety of systems including one or more embodiments of the disclosure. As such, the drawings are not meant to include all conventional features known by those of ordinary skill in the art to be required for the practice of the embodiments disclosed herein.

DETAILED DESCRIPTION

The systems and methods described herein are generally related to analog memory devices, and more particularly, to analog memory devices which utilize Fowler-Nordheim tunneling to provide an adaptive synaptic array for analog memory.

The adaptive synaptic array is comprised of a plurality of Fowler-Nordheim (FN) devices to implement a dynamic analog memory (DAM). Each of these FN-DAM devices is composed of two nodes, each node containing two floating gates connected by a capacitor. By applying a charge to either of the floating gates, the energy barrier is changed, allowing for FN tunneling. As the electrons tunnel through the triangular barrier, the barrier profile changes and inhibits tunneling of electrons.

The FN-DAM system described is suitable for implementing machine learning (ML).

Figure 1:
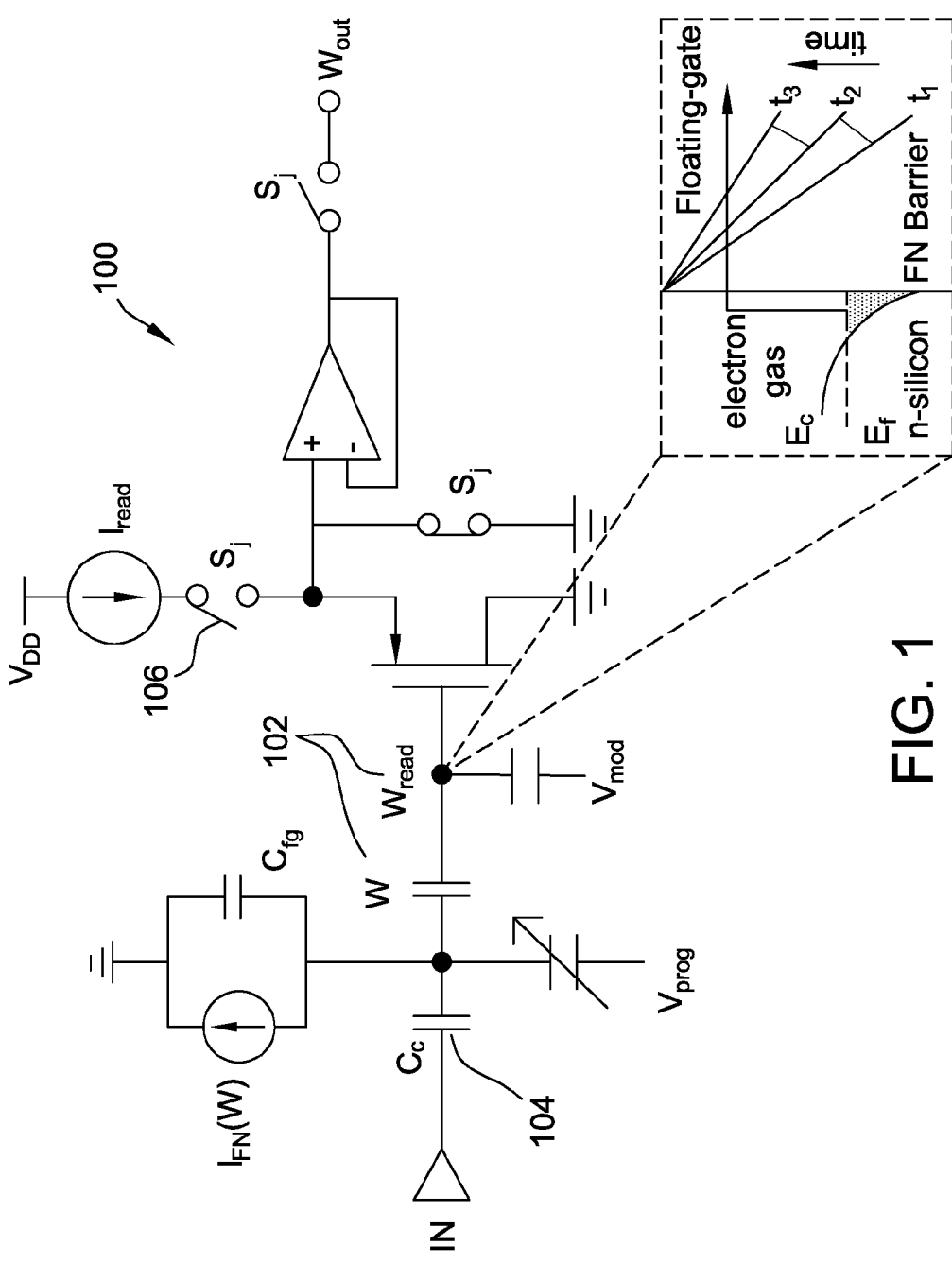
FIG. 1 is a circuit diagram of a single node.

FIG. 1 is a circuit diagram of a single node 100. Each node contains two floating gates 102, a tunneling gate and a readout gate, decoupled via a capacitor 104. A charge is applied to each floating gate 102 individually using a combination of tunneling (to increase charge, coarse tuning) and hot electron injection (to decrease charge, fine tuning). When the charge is applied to the floating gate, the shape of the barrier is modified which facilitates FN tunneling through the modified energy barrier. As the electron tunnels through the triangular barrier the barrier profile changes which further inhibits the tunneling of electrons.

The tunneling gate stores the dynamic analog memory, and a sufficient potential is applied in order to initiate observable FN tunneling. The readout gate is capacitively decoupled from the tunneling gate to avert readout disturbances. The readout node is biased at a lower voltage to prevent injection into the readout node during operation. The potential of the readout node is lowered through hot electron injection. Switch 106 allows for individual control of each FN-DAM block for reading and programming.

V(t) is the floating gate voltage given by:

$$V(t) = \frac{k_2}{\log(k_1 t + k_2)}$$

Where $k_1$ and $k_2$ are device specific parameters and $k_0$ depends on initial condition as:

$$k_0 = \exp\left(-\frac{k_2}{V_0}\right)$$

Using the dynamic given, the Fowler-Nordheim tunneling current can be calculated as:

$$\frac{I_{FN}(V(t))}{C_r} = \frac{d(V(t))}{dt} = \left(\frac{k_1}{k_2}\right)V^2\exp\left(-\frac{k_2}{V}\right)$$

Figure 2:
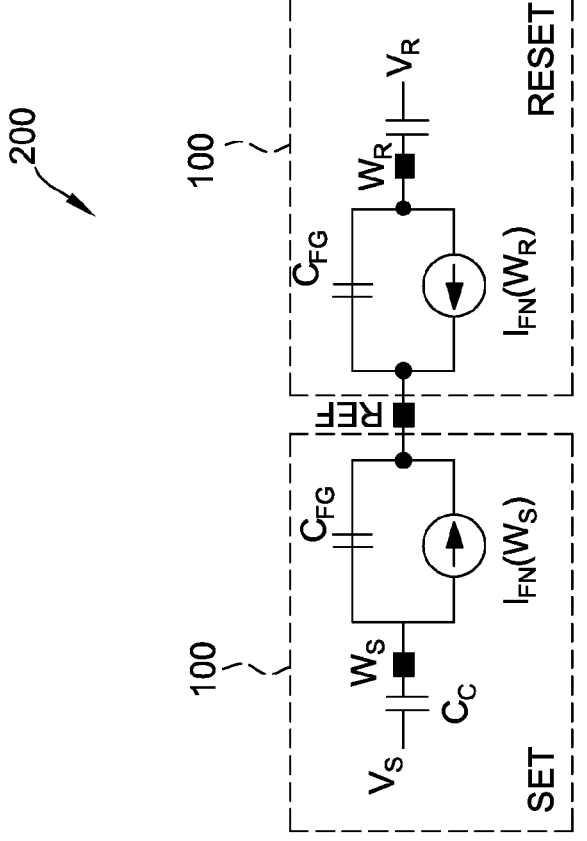
FIG. 2 is a circuit diagram of an analog memory element.

FIG. 2 is a circuit diagram of an analog memory element 200. The memory element contains two nodes 100. The nodes 100 are synchronized FN-dynamical systems used to implement a DAM suitable for implementing ML training/inference engines. FIG. 2 shows the dynamics of the two FN-dynamical systems, labeled as SET and RESET, whose analog states continuously and synchronously decay with respect to time. FN-dynamical systems can be synchronized with respect to each other with an accuracy greater than 99.9%. However, when an external voltage pulse modulates the SET system, the dynamics of the SET system becomes desynchronized with respect to the RESET system. The degree of desynchronization is a function of the state of the memory at different time instances which determines the memory's retention rate.

The dynamics of the FN-tunneling based DAM (or FN-DAM) were verified using prototypes fabricated in a standard CMOS process. The FN-DAM devices were programed and initialized through a combination of FN tunneling and hot electron injection. The tunneling nodes were initialized to around 8 V and decoupled from the readout node by a decoupling capacitor to the sense buffers. The readout nodes were biased at a lower voltage (~3 V) to prevent hot electron injection onto the floating gate during readout operation.

Each DAM in the FN-DAM device is programmed by independently modulating the SET and RESET nodes. The FN-DAM device can be programmed by changing the magnitude or duration of the pulse. The nodes were initially synchronized with respect to each other. After a programming pulse was applied to the SET or RESET control gate, the difference between the voltages at the nodes is measured using an array of sense buffers.

Figure 3:
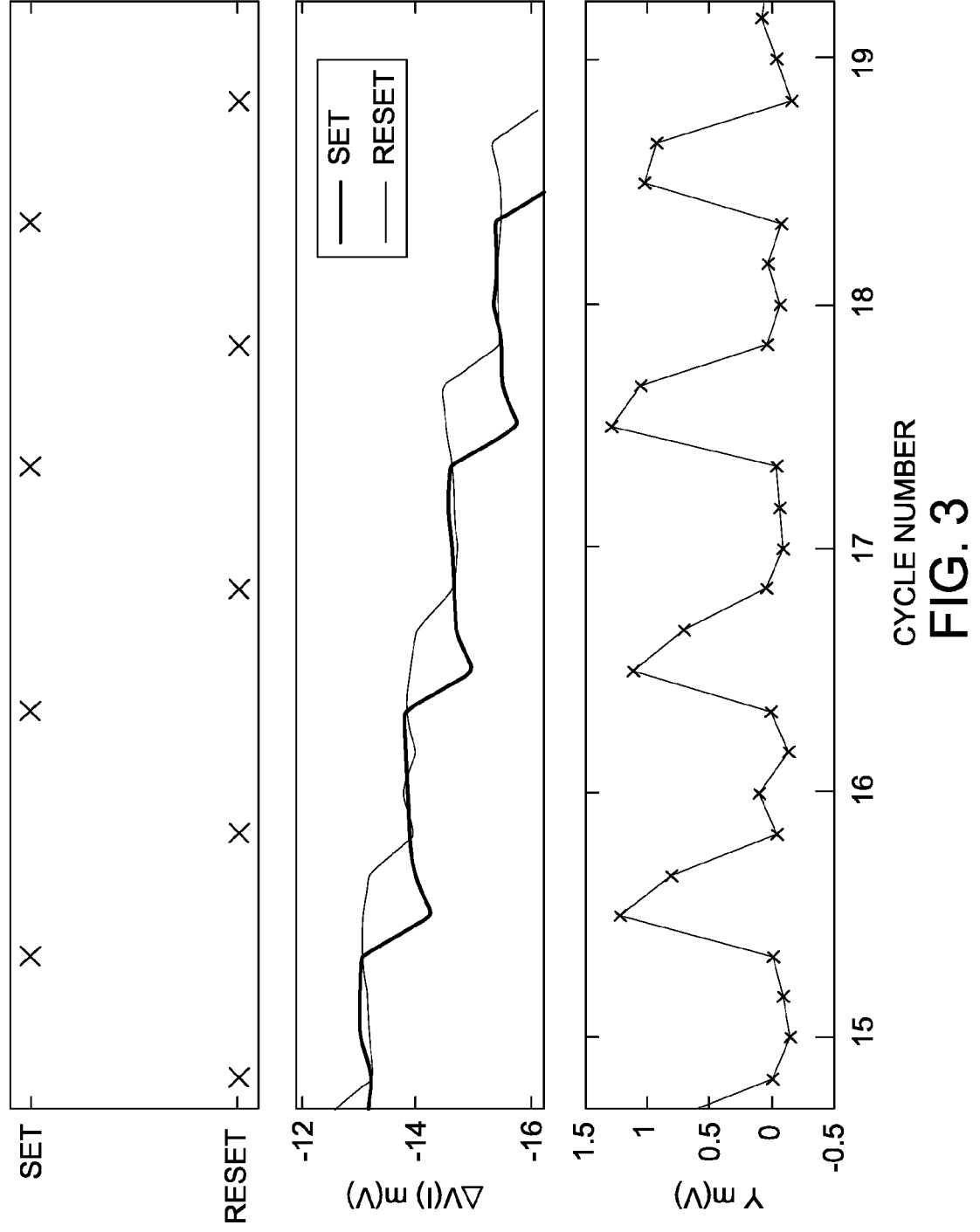
FIG. 3 is a set of graphs showing the measured result of the FN-DAM as it is repeatedly programmed and erased over a first duration.

FIG. 3 is a set of graphs showing the measured result of the FN-DAM as it is repeatedly programmed and erased over a first duration. The charges on the respective floating gates are initialized to approximately the same voltage and the SET and RESET pulses are sequentially applied. The voltage with respect to time v(t) of each of the SET and RESET gates changes in response to the applied pulses. The change seen in Y shows the time evolution of each SET/RESET cycle, where the SET pulse programs bit Y and the RESET signal erases the bit. This repeats for each SET/RESET cycle of programming.

Figure 4:
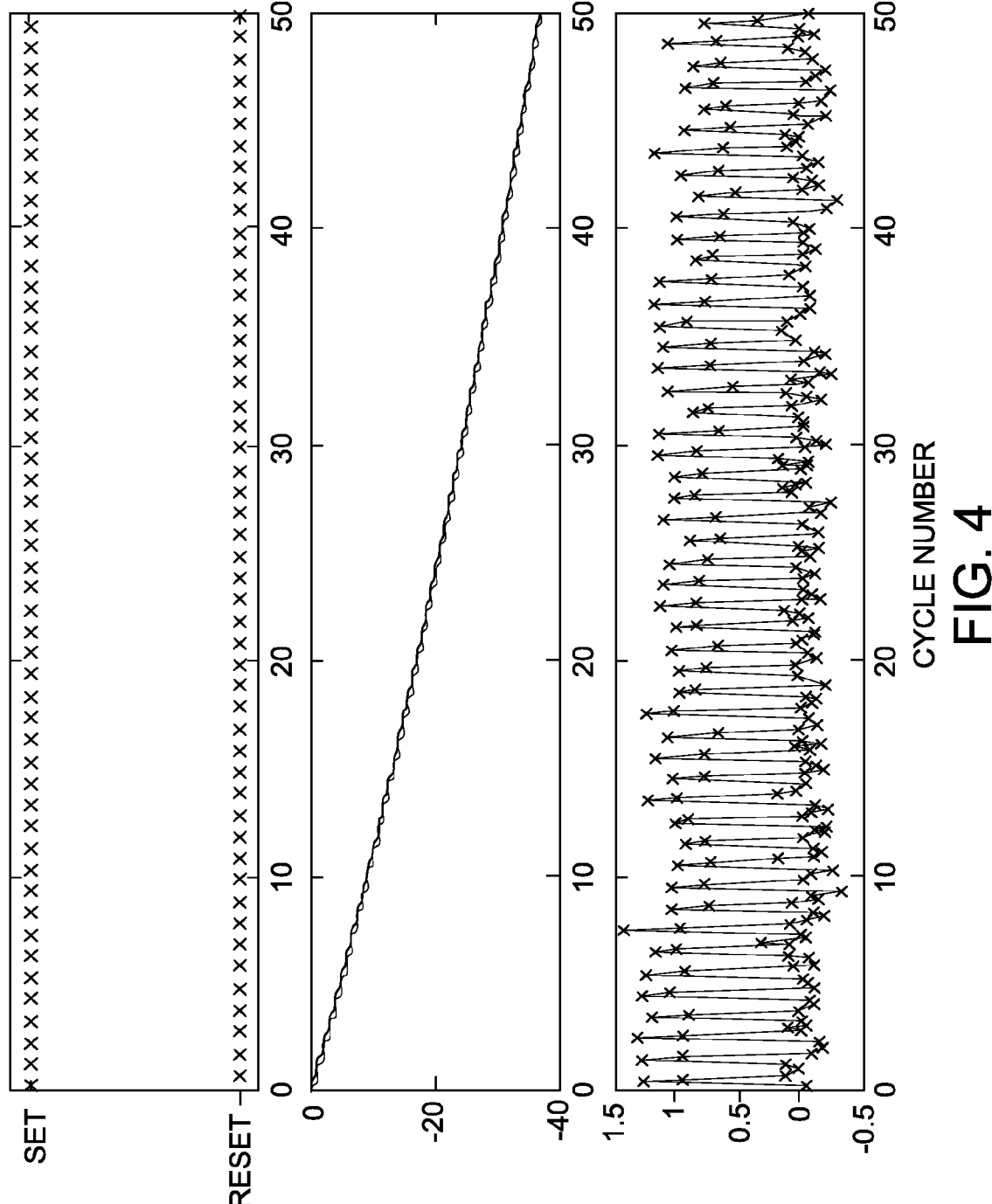
FIG. 4 is a set of graphs showing the measured result of the FN-DAM as it is repeatedly programmed and erased over a longer duration.

FIG. 4 is a set of graphs showing the measured result of the FN-DAM as it is repeatedly programmed and erased over a longer duration. It is estimated that the device can endure more than $10^4$ program-erase cycles. This figure has been estimated based upon the fact that only a small amount of charge leaks from each of the floating gates during each SET/RESET cycle. Further, approximately a 100 µV difference is sensed in the floating gate potential. The low voltage write/erase requirements eliminate the need for high voltage charge pumps which are used in programming of conventional FLASH memories.

Figure 5A:
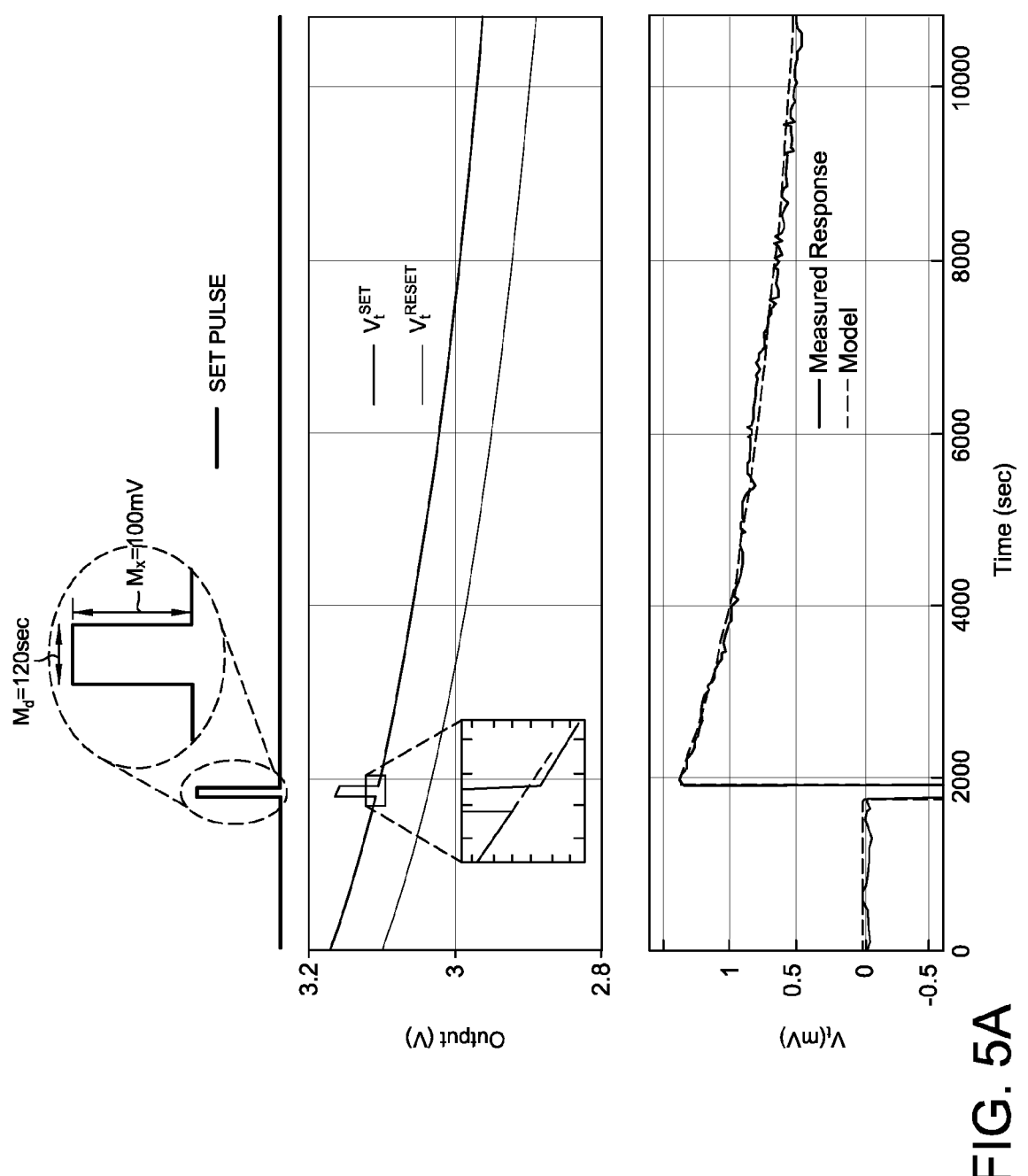
FIGS. 5A and 5B are a set of graphs showing the output measured from the FN-DAM when the SET pulse is applied and the responses measured from three synaptic elements across three trials.
Figure 5B:
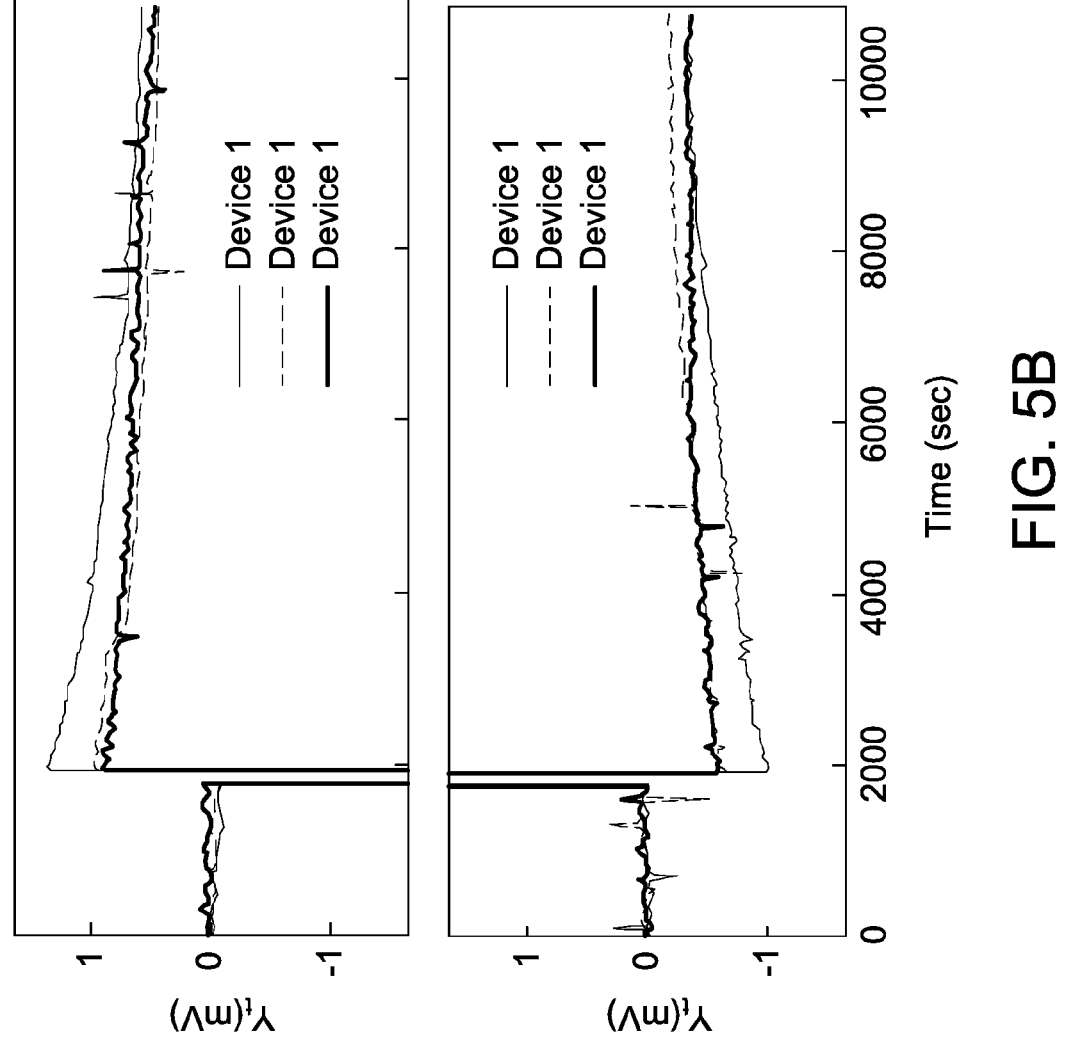

FIG. 5 is a set of graphs showing the output measured from the FN-DAM when the SET pulse is applied, and the responses measured from three synaptic elements across three trials. The retention time for the FN-DAM is flexible and determines the energy budget for the SET/RESET functions. In one example, if a retention time in years is desired, the SET/RESET energy per bit may be 100 fJ/bit. However, the FN-DAM may also be biased in a region where the device exhibits decay, similar to decay observed in biological synapses. In such an example, it is estimated that the device can operate at an energy budget lower than an attojoule, while exhibiting a leakage time-constant of at least 3 hours. The quiescent leakage current is the FN quantum tunneling current, which is source from the pre-charged capacitor and ambient thermodynamic fluctuations. Therefore, no external power source is required for transporting electrons. If the energy dissipated at the input signal source (due to finite source impedance) is ignored, the energy budget required to modulate the state of the FN device is less than 100 aJ. In practice, the energy from the source is spent on charging the capacitor and for maintaining DC voltage at the source. For example, when the magnitude of the SET signal is 100V (as shown in FIG. 5), only 15 fJ is used for charging a 300 fF input capacitor. The DC input impedance of the FN-DAM was measured to be greater than $10^{17}$; thus the energy required to maintain a voltage potential of 100 mV for 120 sec is less than 100 aJ.

Figure 6:
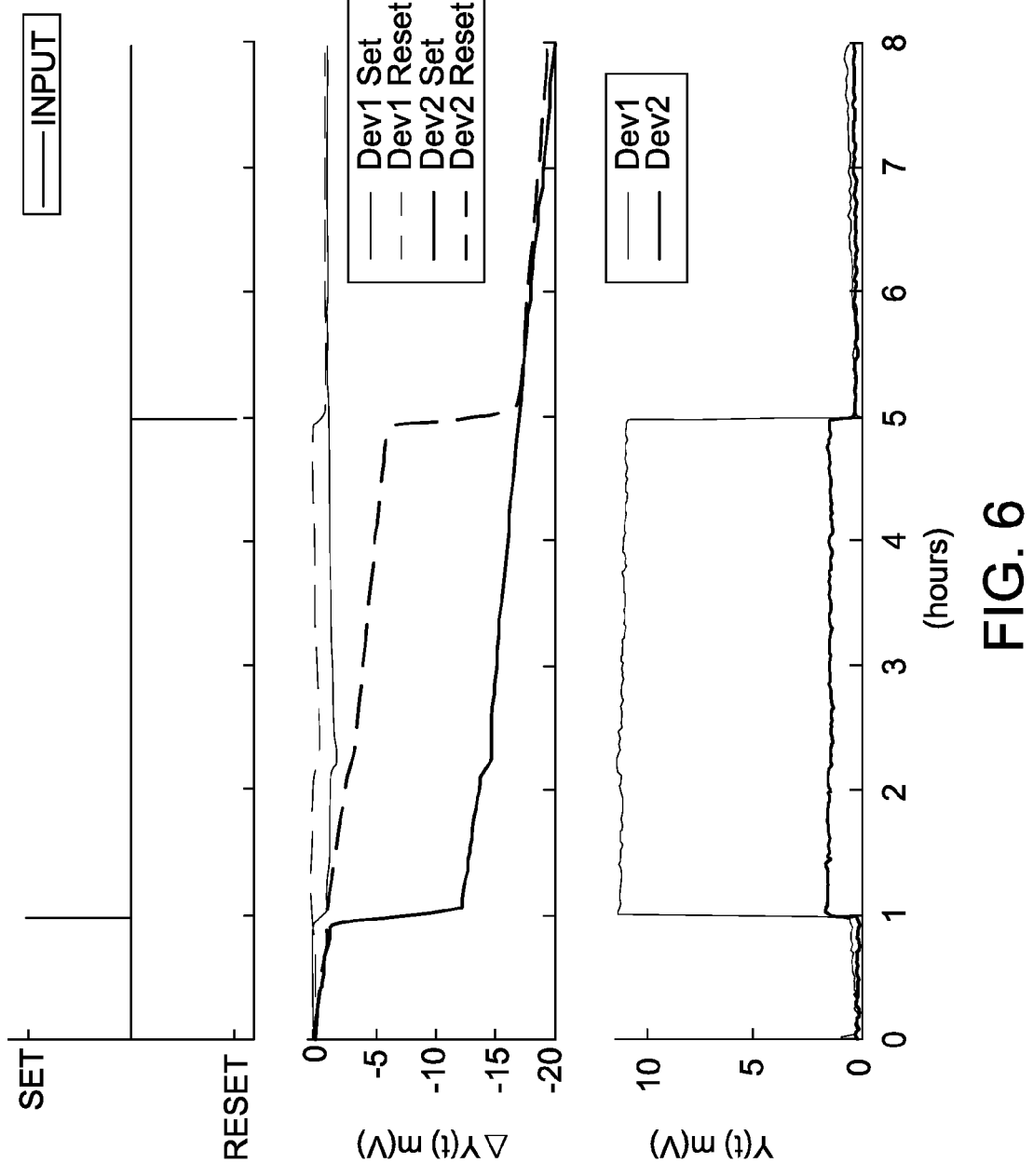
FIG. 6 is a graph of a measured results of the memory state of the synaptic element that is retained between the SET and RESET pulses.

FIG. 6 is a graph of a measured results of the memory state of the synaptic element that is retained between the SET and RESET pulses. The FN-DAM has been initialized in a high retention region. In this operating condition, a 3V SET and RESET pulse (duration of 1 ms) has been applied and the state of the memory is retained for a duration of at least 4 hours. It is estimated that the synaptic element can show retention of a few days to a year without significant information loss.

Figure 7:
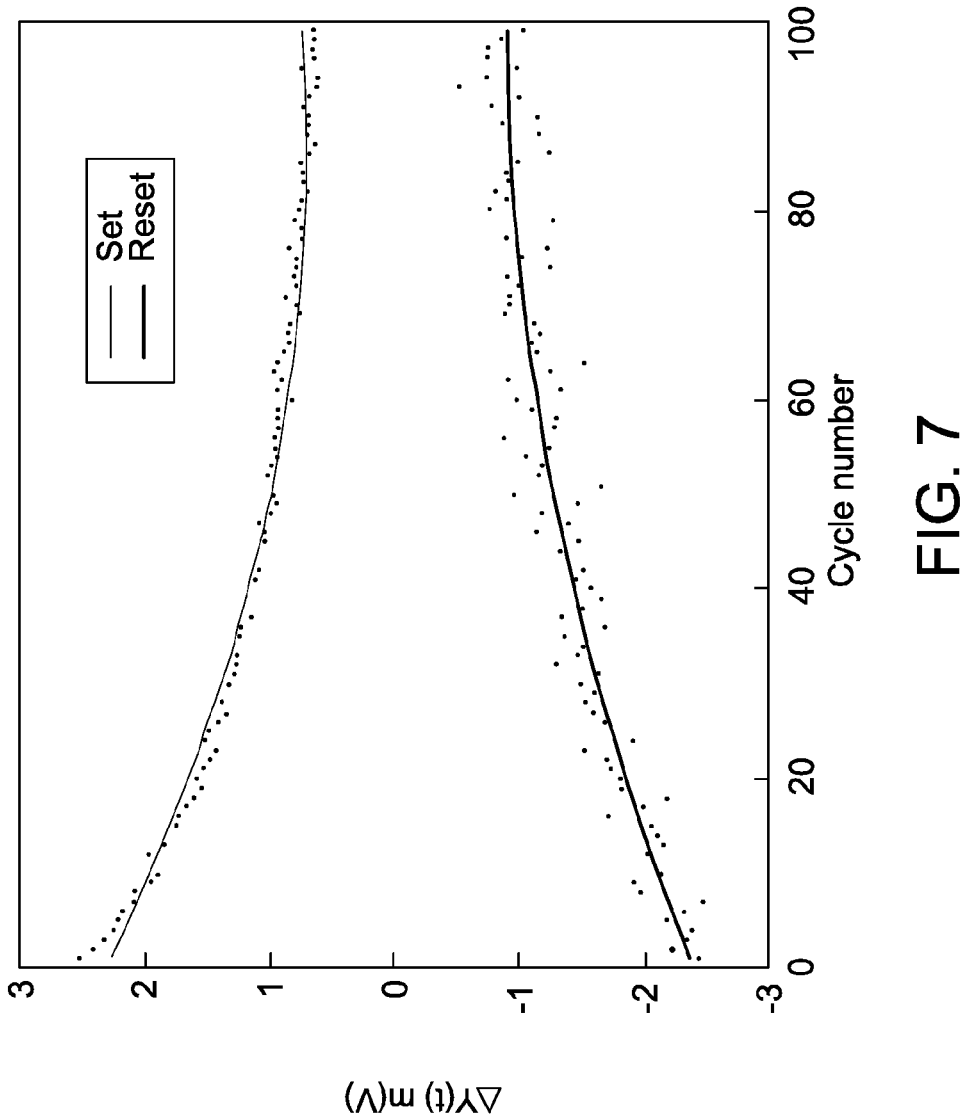
FIG. 7 is a graph showing the analog state of the FN-DAM after each programming cycle.

FIG. 7 is a graph showing the analog state of the FN-DAM after each programming cycle. The FN-DAM may also be used to store an analog value based on the number of SET and RESET pulses. The graph depicts measured results from a prototype showing the state of the device Y(t) after the SET and RESET pulses are sequentially applied.

Figure 8:
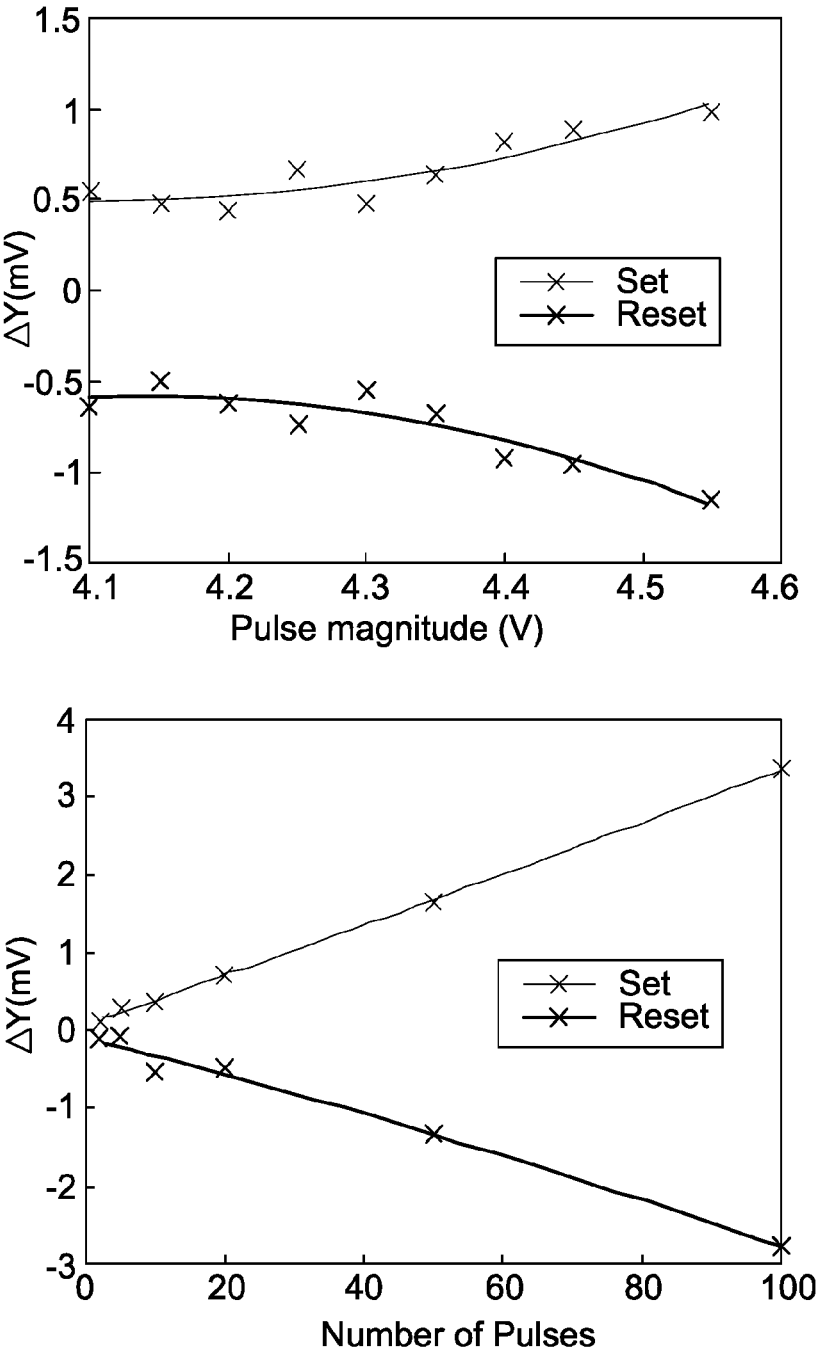
FIG. 8 is a graph showing the state of the synaptic memory under different conditions by varying the pulse magnitude and the number of pulses.

FIG. 8 is a graph showing the state of the synaptic memory under different conditions by varying the pulse magnitude and the number of pulses. This demonstrates the ability of the FN-DAM to store analog values based on the number and magnitude of SET and RESET pulses applied.

Figure 9:
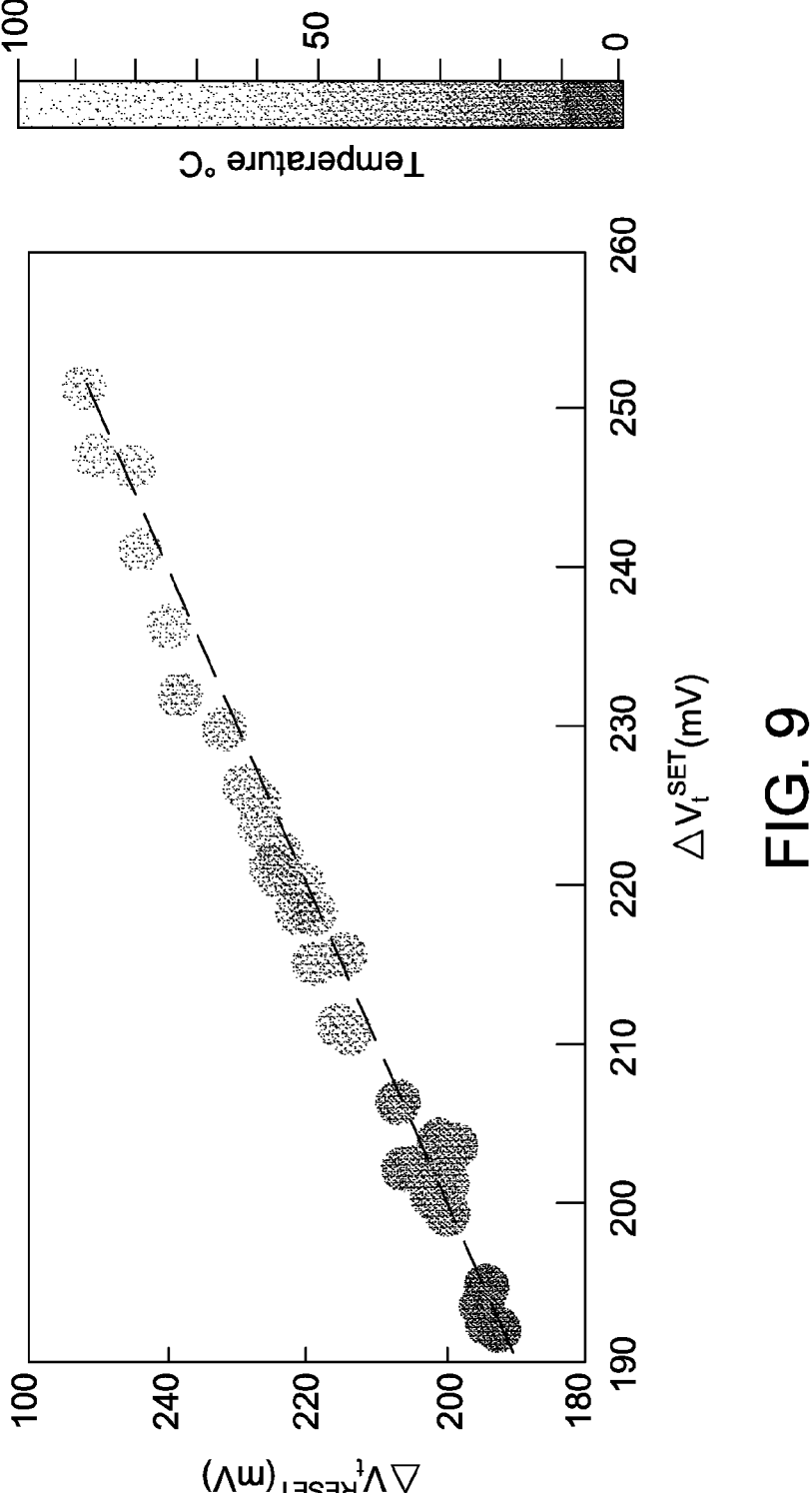
FIG. 9 is a graph showing the synchronization measured across a range of operating temperatures.

FIG. 9 is a graph showing the synchronization measured across a range of operating temperatures. The FN-DAM is able to withstand drift and temperature variations. Post-drift corrections show the maximum difference between a pair of trials to be less than 300 µV. The desynchronization is measured across temperature ranting from 5° C. to 40° C. Higher temperatures results in faster tunneling, which leads to a larger variation in $V_t$ within the range of 200 to 260 mV as a function of temperature. Despite this variation, the measured desynchronization between the SET and RESET timers show a significantly lower variance with standard deviation below 1 mV. These results show that the differential architecture is capable of compensating for variations in temperature.

Figure 10:
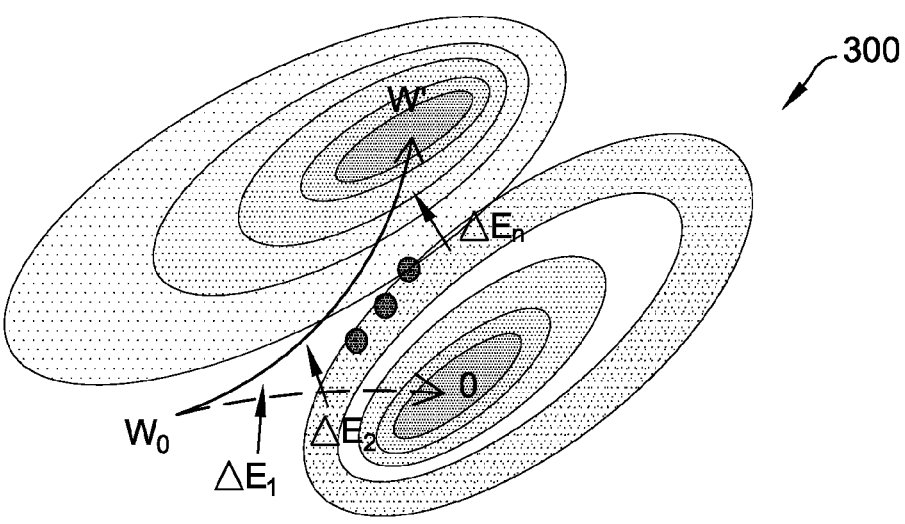
FIG. 10 is a graphic representation of a dynamic analog memory.

FIG. 10 is a graphic representation of a dynamic analog memory. The system 300 shows a reference ensemble trajectory that continuously decays towards a zero vector without the presence of any external modulation. However, during the process of learning, the trajectory of the memory ensemble is pushed towards an optimal solution W*. The extrinsic energy ( . . . , ΔEn−1, ΔEn, ΔEn+1, . . . ) required for modulation, if matched to the dynamics of learning, reduces the energy-budget for ML training.

Figure 11:
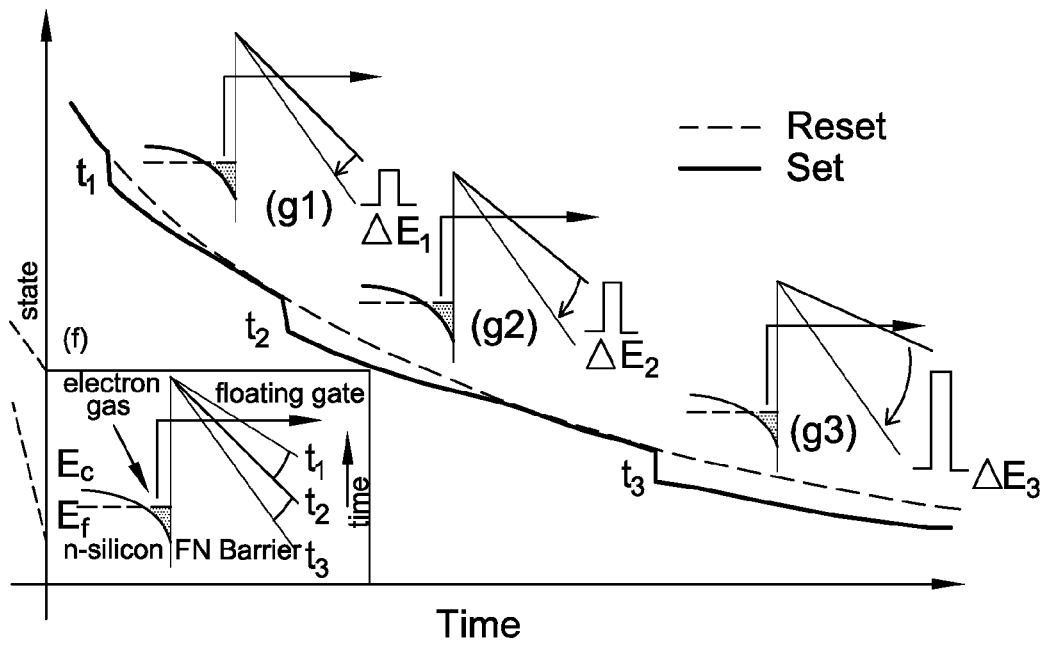
FIG. 11 is a graph dynamic states of the Fowler-Nordheim based dynamic analog memory.

FIG. 11 is a graph dynamic states of the Fowler-Nordheim based dynamic analog memory. At time-instant t1, a small magnitude pulse would produce the same degree of desynchronization as a large magnitude pulse at the time-instant t3. However, at t1 the pair of desynchronized systems (SET and RESET) would resynchronize more rapidly as compared to desynchronized systems at time-instants t2 or t3. This resynchronization effect results in shorter data retention; however, this feature could be leveraged to implement weight-decay in ML training. At time instant t3, the resynchronization effect is weak enough that the FN-dynamical system acts as a persistent non-volatile memory with high data-retention time.

FIG. 12 is a graph of the analog synapse characteristic during training and inference. The graph shows a convergence plot corresponding to a typical ML system as it transitions from a training phase to an inference phase. During the training phase, the synaptic weights are adapted based on some learning criterion whereas in the inference phase the synaptic weights remain fixed or are adapted intermittently to account for changes in the operating conditions. Generally, during the training phase the amount of weight updates is significantly higher than in the inference phase, as a result, memory update operations require a significant amount of energy. Take for example support-vector machine (SVM) training, the number of weight updates scale quadratically with the number of support vectors and the size of the training data, whereas adapting the SVM during inference only scales linearly with the number of support-vectors. Thus, for a constant energy dissipation per update, the total energy-dissipated due to weight updates is significantly higher in training than during inference. However, if the energy-budget per weight updates could follow a temporal profile as shown in FIG. 12 wherein the energy dissipation is no longer constant, but inversely proportional to the expected weight update rate, then the total energy dissipated during training could be significantly reduced. One way to reduce the weight update or memory write energy budget is to trade-off the weight's retention rate according to the profile shown in FIG. 12. During the training phase, the synaptic element can tolerate lower retention rates or parameter leakage because this physical process could be matched to the process of weight decay or regularization, techniques commonly used in ML algorithms to achieve better generalization performance. The memory's retention rate should increase as the training progresses such that at convergence or in the inference phase the weights are stored on a non-volatile memory.

FIG. 13 is a plot of the voltage versus time response under three different operating conditions. FIG. 13 shows the measured dynamics of the FN-DAM device in different initialization regimes used in ML training. The different regimes were obtained by initializing the tunneling nodes (WS and WR) to different voltages, whilst ensuring that the tunneling rates on the WS and WR nodes were equal. Initially (during the training phase), tunneling-3 node voltages were biased high (readout node voltage of 3.1 V), leading to faster FN tunneling. A square input pulse of 100 mV magnitude and 500 ms duration (5 fJ of energy) was found to be sufficient to desynchronize the SET node by 1 mV. However the rate of resynchronization in this regime is high leading to a decay in the stored weight down to 30% in 40 s. At t 7=90 s, the voltage at node WS has reduced (readout node voltage of 2.9 V), and a larger voltage amplitude 8 (500 mV) is required to achieve the same desynchronization magnitude of 1 mV, corresponding to an energy expenditure of 125 fJ. However the rate of resynchronization is low in this regime, leading to a decay in the stored weight down to 70% its value in 40 s. Similarly, at a later time instant t=540 s, a 1 V signal desynchronizes the recorder by 1 mV, however as shown in this regime 95% of the stored weight value is retained after 40 s. This mode of operation is suitable during the inference phase of machine learning when the weights have already been trained, but the models need to be sporadically adapted to account for statistical drifts. Modeling studies show that the write energy per update starts from as low as 5 fJ and increases to 2.5 pJ over a 16 period of a period of 12 days.

Figures 14A, 14B, 14C, 14D, 14E, 14F:
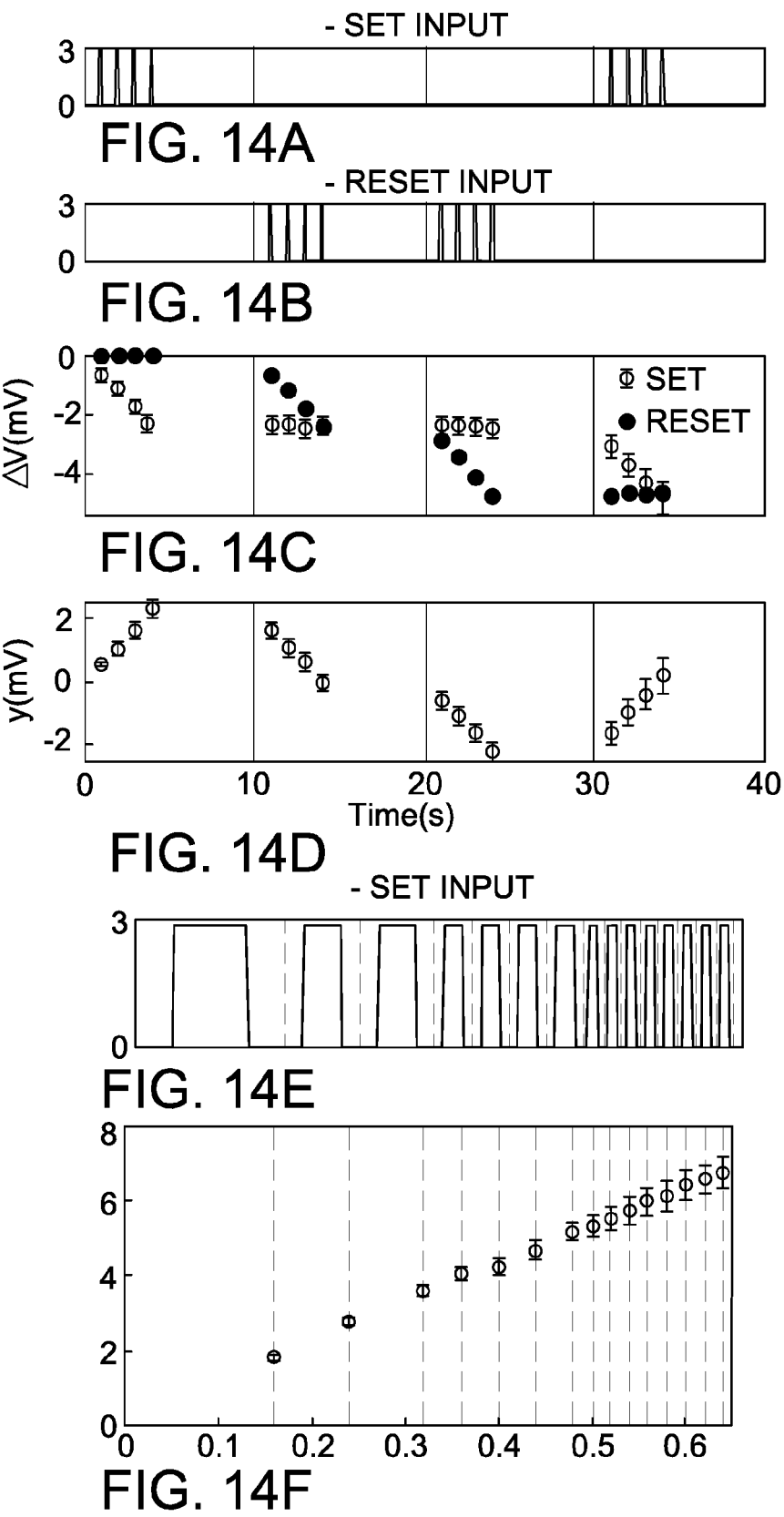
FIGS. 14A-14F are a set of graphs of the FN-DAM response to SET pulses of varying frequency.

FIG. 14 is a graph of the FN-DAM response to SET pulses of varying frequency. In results 27 shown in FIG. 3a-d, a sequence of 100 ms SET and RESET pulses were applied. The measured difference 28 between the voltages at the WS and WR nodes indicates the state of the memory. Each SET pulse increases 29 the state while a RESET pulse decreases the state. In this way, the FN-device can implement a DAM that is bidirectionally programmable with unipolar pulses. FIG. 3d also shows the cumulative nature of the FN-2 DAM updates which implies that the device can work as an incremental/decremental counter.

Figures 15A, 15B:
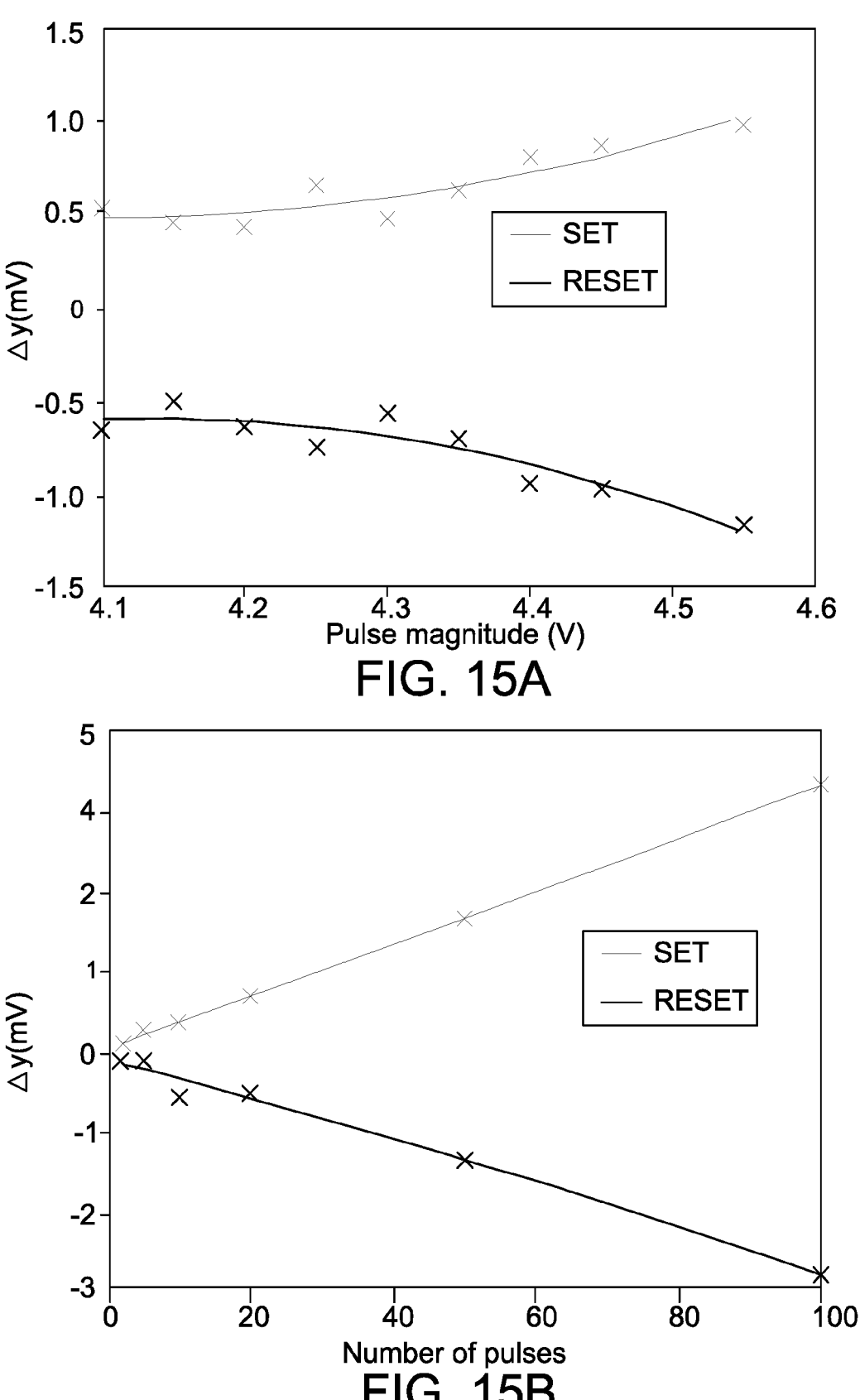
FIGS. 15A-15D are a set of graphs of the FN-DAM response in various operating conditions.
Figures 15C, 15D:
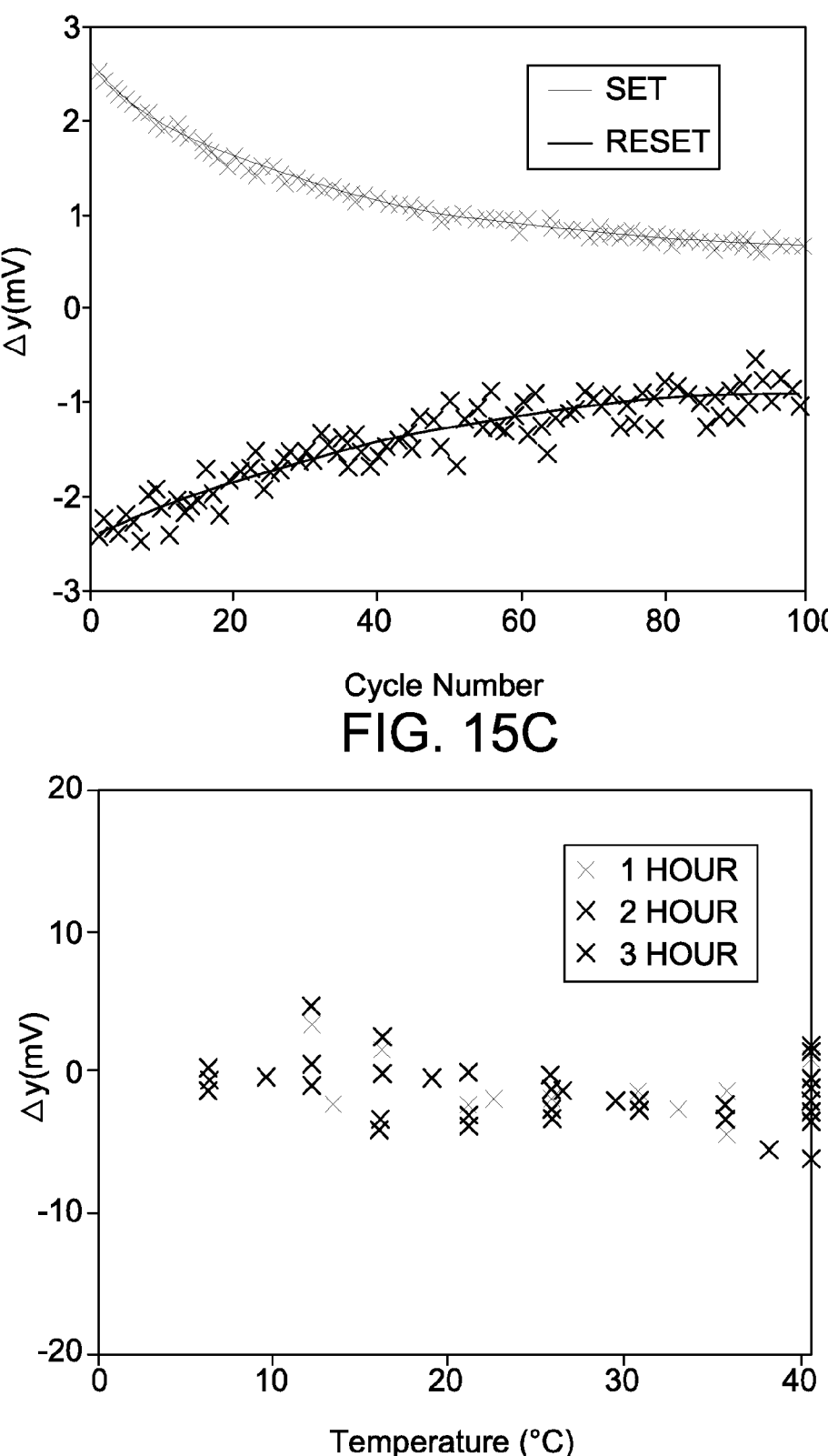

FIG. 15 is a characterization of the FN-DAM response in various operating conditions. The measurement results demonstrate the resolution at which a FN-DAM can be programmed as an analog memory. The analog state can be updated by applying digital pulses of varying frequency and variable number of pulses. Four cases of applying a 3V SET signal for a total of 100 ms are shown: a single 100 ms pulse; two 50 ms pulses; four 25 ms pulses; and eight 12.5 ms pulses. The results show the net change in the stored weight was consistent across the cases. A higher frequency leads to a finer control of the analog memory updates. Note that any variations across the devices can be calibrated or mitigated by using an appropriate learning algorithm. The variations could also be reduced by using careful layout techniques and precise timing of the control signals.

Figures 16A, 16B, 16C, 16D, 16E, 16F:
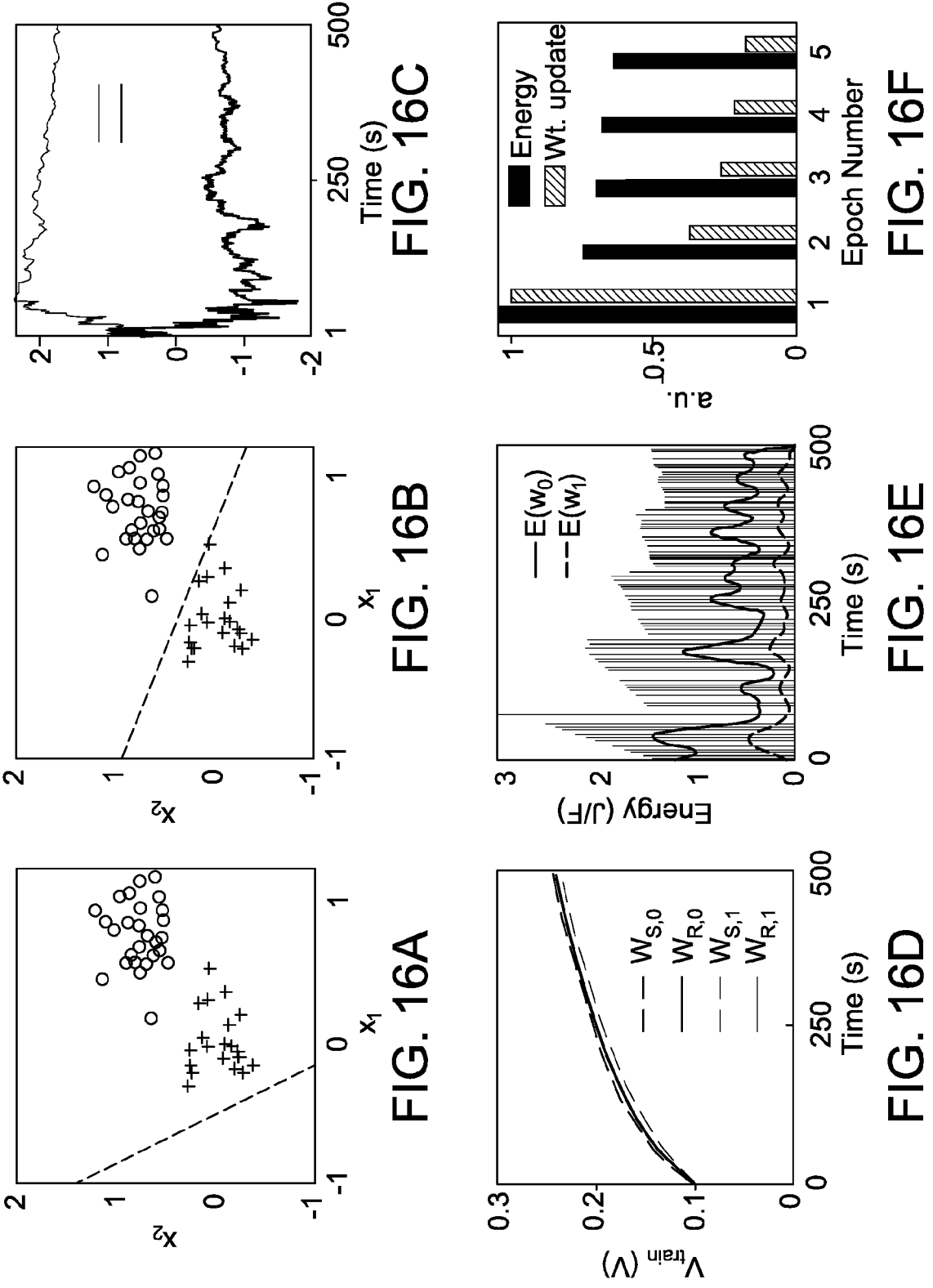
FIGS. 16A-16F are a set of graphs of the neuromorphic applications of the synaptic memory.

FIG. 16 is a graphical representation of the neuromorphic applications of the synaptic memory. FIG. 16 shows response when the magnitude of the SET and RESET input signals varies from 4.1 V to 4.5 V. The measured response shows an exponential relationship with the amplitude of the signal. When short-duration pulses are used for programming, the stored value varies linearly with the number of pulses. However, repeated application of pulses with constant magnitude produces successively smaller change in programmed value due to the dynamics of the DAM device. One way to achieve a constant response is to pre-compensate the SET/RESET control voltages such that a target voltage difference y=5 (WS−WR) can be realized. The differential architecture increases the device state robustness against disruptions from thermal fluctuations. The stored value on DAM devices will leak due to thermal-induced processes or due to trap-assisted tunneling. However, in DAM, the weight is stored as difference in the voltages corresponding to WS and WR tunneling junctions which are similarly affected by temperature fluctuations. To verify this, the FN-DAM device was exposed to temperature ranging from 5-40° C. The DAM response is robust to temperature variation and the amount of desynchronization for a single recorder never exceeds 20 mV. When responses from multiple FN-DAM devices are pooled together, the variation due to temperature further reduces.

Figures 17A, 17B, 17C:
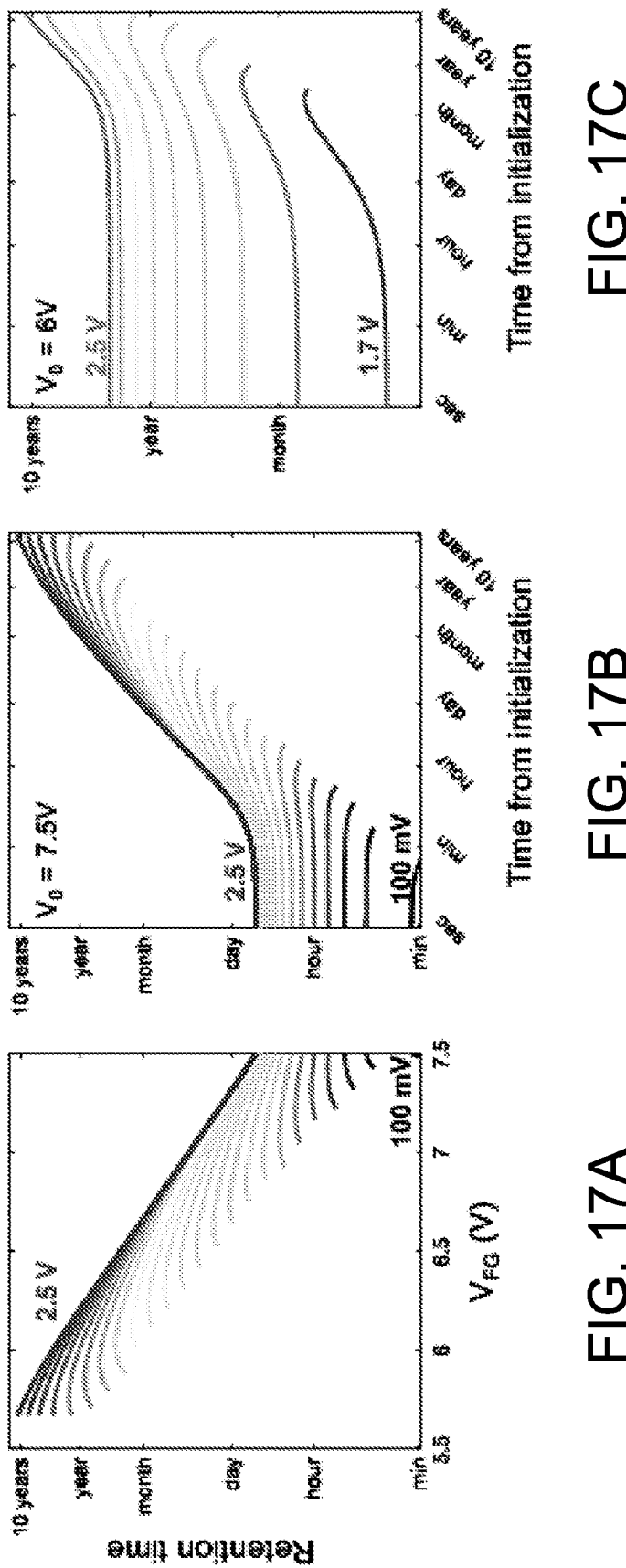
FIGS. 17A-17C are a set of graphs showing memory retention.

There are benefits of exploiting the dynamics of FN-DAM weights when training a simple linear classifier. In one example, two FN-DAM devices are independently programmed according to the perceptron training rule. The weights are trained to classify a linearly separable dataset comprises 50 instances of two-dimensional vectors, shown in FIG. 16. During each epoch, the network loss function and gradients were evaluated for every training point in a randomized order, with time interval between successive training points being two seconds. FIG. 16 shows that after training for 5 epochs, the learned boundary can correctly classify the given data. FIG. 16 shows 3 the evolution of weights as a function of time. As can be noted in the figure, initially the magnitude of weight updates (negative of the cost function gradient) was high for the first 50 seconds, after which the weights stabilized and required smaller updates. The energy consumption of the training algorithm can be estimated based on the magnitude and number of the SET/RESET pulses required to carry out the required update for each misclassified point. As the SET/RESET nodes evolve in time, they require larger voltages for carrying out updates, shown in FIG. 16. The gradient magnitude was mapped onto an equivalent number 9 of 1 kHz pulses, rounding to the nearest integer. FIG. 16 shows the energy (per unit capacitance) required to carry out the weight update whenever a point was misclassified. Though the total magnitude of weight update decreased with each epoch, the energy required to carry out the updates had lower variation. The relatively larger energy required for smaller weight updates at later epochs led to longer retention times of the weights As shown by FIG. 17, the retention time is the point at which the analog memory, due to resynchronization, falls below the noise floor. The noise floor consists of a constant noise introduced by the readout noise and an operational noise that increases with time, due to thermally induced random synchronization. Retention time is shown as a function of floating gate voltage for a range of input pulse magnitudes. Retention time is also shown as a function of time elapse after initialization to 7.5V and 6V.

$$\text{Total noise: } \sigma_T(t) = \sigma_0 + \sigma(t)$$

In this case, it was assumed that $\sigma_0 = 100\,\mu V$ and estimated that $\sigma_t = 1.4t^{0.5}\,\mu V$ from experiments without any external pulse. At $T_{Ret}$, synaptic memory's state goes below the noise floor and hence the following condition is satisfied:

$$w(T_{Ret}) = \sigma_T(T_{Ret})$$

When the FN-DAM is biased at around 6 V, its retention time is similar to FLASH/EEPROM memory. However, energy consumption is around 150 fJ (for a 100 fJ input capacitance).

Figure 18A:
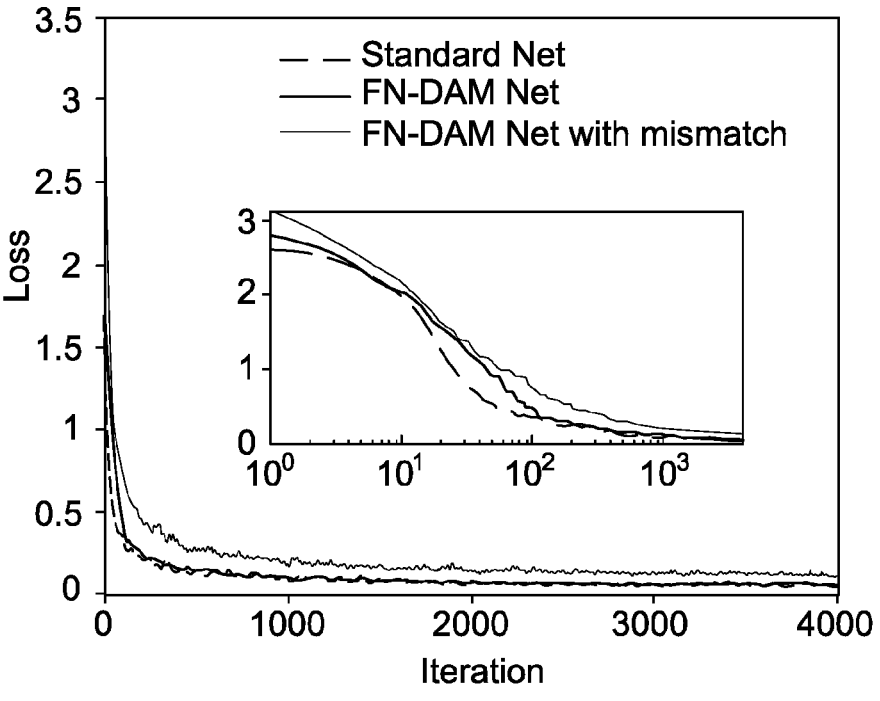
FIGS. 18A and 18B are a set of graphs showing network loss for 3 types of network models.
Figure 18B:
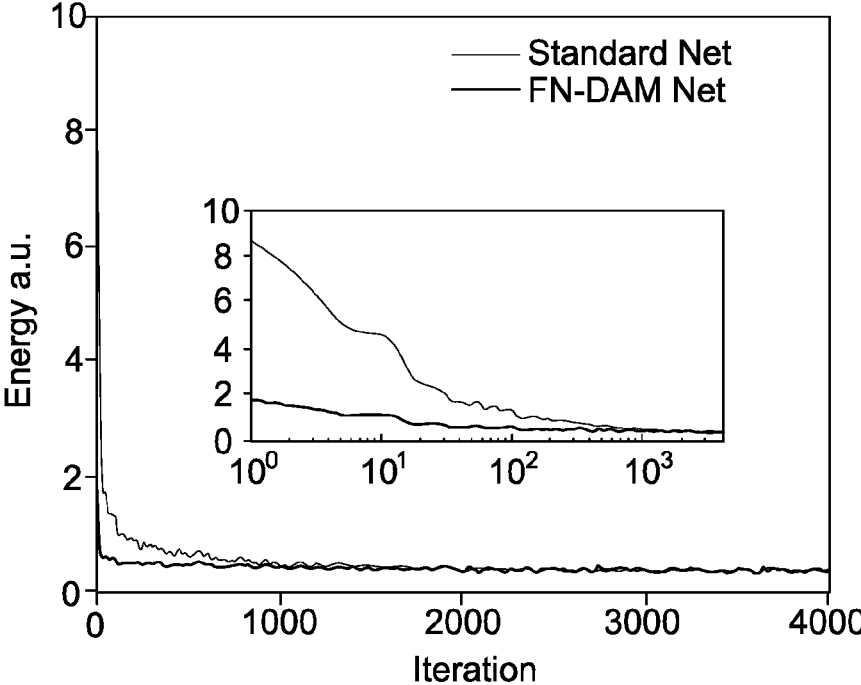

FIG. 18 is a graph showing network loss for 3 types of network models. The performance of FG-DAM model was compared to that of a standard network model. A 15-layer convolutional neural network was trained on the MNIST dataset using the MATLAB Deep Learning Toolbox. For each learnable parameter in the CNN, a software FN-DAM instance corresponding to that parameter was created. In each iteration, the loss of the network function and gradients were calculated. The gradients were used to update the weights via Stochastic Gradient Descent with Momentum (SGDM) algorithm. The updated weights were mapped onto the FN-DAM array. The weights in the FN-DAM array were decayed. These weights were then mapped back into the CNN. This learning process was carried on for epochs. In the 10th epoch, no gradient updates were performed. However, the weights were allowed to decay for the last epoch (note that in the standard CNN case, the memory was static). A special case with a 0.1% randomly assigned mismatch in the floating gate parameters (k1 and k2) was also implemented.

| Accuracy (%) | After 9 epochs | After 10 epochs |
| --- | --- | --- |
| Standard CNN | 98.6 | 98.6 |
| FN-DAM CNN | 99 | 99.2 |
| FN-DAM CNN with mismatch | 97.4 | 96.3 |

Fowler-Nordheim quantum tunneling based dynamic analog memory (FN-DAM) physical dynamics can be matched to the dynamics of weight updates used in machine learning (ML) or neural network training. During the training phase, the weights stored on FN-DAM are plastic in nature and decay according to a learning-rate evolution that is necessary for the convergence of gradient-descent training. As the training phase transitions to an inference phase, the FN-DAM acts as a non-volatile memory. As a result, the trained weights are persistently stored without requiring any additional refresh steps (used in volatile embedded DRAM architectures). The plasticity of FN-DAM during the training phase can be traded off with the energy-required to update the weights. The number of weight updates during training scale quadratically with the number of parameters, hence the energy-budget during training is significantly higher than the energy-budget for inference. The dynamics of FN-DAM bears similarity to the process of annealing used in neural network training and other stochastic optimization engines to overcome local minima artifacts. Thus, it is possible that FN-DAM implementations or ML processors can naturally implement annealing without dissipating any additional energy. If such dynamics were to be emulated on other analog memories, it would require additional hardware and control circuitry.

FN-DAM based deep neural network (DNN) can achieve similar classification accuracy as a conventional DNN while dissipating significantly less energy during training. Only the fully connected layers were trained while the feature layers are kept static. This mode of training is common for many practical DNN implementations on edge computing platforms where the goal is not only to improve the energy-efficiency of inference but also for training.

Training a large-scale neural network may take days to months depending on the complexity of the problem, complexity of the network, and the size of the training data. This implies that the FN-DAM dynamics need to match the long training durations as well. Fortunately, the 1/log characteristics of FN devices ensures that the dynamics could last for durations greater than a year. Measurement precision may need to be considered when scaling of FN-DAM to a large neural network. The resolution of the measurement and the read-out circuits limit the energy-dissipated during memory access and how fast the gradients can be computed. For instance, a 1 pF floating-gate capacitance can be initialized to store $10^7$ electrons. Even if one were able to measure the change in synaptic weights for every electron tunneling event, the read-out circuits would need to discriminate 100 nV changes. This might be handled in practice by measuring the change in voltage after 1000 electron tunneling events which would imply measuring 100 5 $\mu V$ changes, although this may reduce the resolution of the stored weights/updates to 14 bits. While this resolution may be sufficient for training a medium sized neural network, it may not be ideal for training large-scale networks in some instances. A mechanism to improve the dynamic range and the measurement resolution is to use a current-mode readout integrated with current-mode neural network architecture. If the read-out transistor is biased in weak-inversion, 120 dB of dynamic range may be achieved. However, note that in this operating mode, the resolution of the weight may be limited by the number of electrons and the quantization due to electron transport.

Speed of programming is another issue to be aware of that arises due to finite number of electrons stored on the floating-gate and transported across the tunneling barrier during SET and RESET. Shorter duration programming pulses may reduce the change in stored voltage (weight) which could be beneficial if precision in updates is desired. In contrast, by increasing the magnitude of the programming pulses, as shown in FIG. 15, the change in stored voltage can be coarsely adjusted, but may limit the number of updates before the weights saturate. Note that due to device mismatch the programmed values may be different on different FN-DAM devices.

After a single initialization the FN-DAM can support $10^3$-$10^4$ update cycles before the weight saturates. However, at the core FN-DAM is a FLASH technology and could potentially be reinitialized again. Given that the endurance of FLASH memory is $10^3$, it is anticipated that FN-DAM to have an endurance of $10^6$-$10^7$ cycles. In terms of other memory performance metrics, the $I_{ON}/I_{OFF}$ ratio for the FN-DAM is determined by the operating regime and the read-out mechanism. FN-DAM when biased as a non-volatile memory requires on-chip charge-pumps only to generate high-voltage programming pulses for infrequent global erase; thus, compared to FLASH memory, FN-DAM should have fewer failure modes.

An advantage of FN-DAM compared to other emerging memory technologies is its scalability and compatibility with CMOS. At its core, FN-DAM is based on floating-gate memories which have been extensively studied in context of machine learning architectures. Furthermore, from an equivalent circuit point of view, FN-DAM could be viewed as a capacitor whose charge can be precisely programmed using CMOS processing elements. FN-DAM also provides a balance between weight-updates that are not too small so that learning never occurs versus weight-updates being too large such that the learning becomes unstable. The physics of FN-DAM ensures that weight decay (in the absence of any updates) towards a zero vector (due to resynchronization) which is important for neural network generalization.

Like other analog non-volatile memories, FN-DAM could be used in any previously proposed compute-in-memory (CIM) architectures. However, in conventional CIM implementations the weights are trained offline and then downloaded on chip without retraining the processor. This makes the architecture prone to analog artifacts like offsets, mismatch and non-linearities. On-chip learning and training mitigates this problem whereby the weights self-calibrate for the artifacts to produce the desired output. However, to support on-chip training/learning, weights need to be updated at a precision greater than 3 bits. In this regard FN-DAM exhibit a significant advantage compared to other analog memories. Even though in these examples, a hybrid chip-in-the-loop training paradigm was used, it is anticipated that in the future the training circuits and FN-DAM modules could be integrated together on-chip.

The FN-DAM array discussed required initialization. For each node of each recorder, the readout voltage was programmed to around 3 V while the tunneling node was operating in the tunneling regime. This is achieved through a combination of tunneling and injection. Specifically, VDD was set to 7 V, input to 5V, and the program tunneling pin is gradually increased to 23 V. Around 12-13V the tunneling node's potential would start increasing. The coupled readout node's potential would also increase. When the readout potential went over 4.5 V, electrons will start injecting into the readout floating gate, thus ensuring its potential is clamped below 5 V. After this initial programming, VDD is set to 6 V. After one-time programming, input was set to 0 V, input tunneling voltage is set to 21.5 V for 1 minute and the floating gate is allowed to discharge naturally. Readout voltages for the SET and RESET nodes were measured every 500 milliseconds. The rate of discharge for each node is calculated; and a state where the tunneling rates would be equal is chosen as the initial synchronization point.

Many neural network training algorithms are based on solving an optimization problem of the form:

$$\min_{\overline{w}} H(w) = \frac{\alpha}{2}\|\overline{w}\| + \mathcal{L}(\overline{w})$$

where $\overline{w}$ denotes the network synaptic weights, $\mathcal{L}(\bullet)$ is a loss-function based on the training set and $\alpha$ is a hyper-parameter that controls the effect of the $\mathcal{L}_2$ regularization. Applying gradient descent updates on each element wi of the weight vector $\overline{w}$ as:

$$w_{i,n+s} - w_{i,x} = -\alpha\eta_n w_{i,n} - \eta_n \frac{\delta\mathcal{L}(\overline{w})}{\delta w_{i,n}}$$

where the learning rate $\eta_n$ is chosen to vary according to $\eta_n \sim O(1/n)$ to ensure convergence to a local minimum.

The naturally implemented weight decay dynamics in FN-DAM devices can be modeled by applying Kirchhoff's Current Law at the SET and RESET floating gate nodes.

$$C_T\frac{d}{dt}(W_S) + I_{FN}(W_S) = C_C\frac{d}{dt}(V_{SET})$$

$$C_T\frac{d}{dt}(W_R) + I_{FN}(W_R) = C_C\frac{d}{dt}(V_{RESET})$$

where $C_{FG}+C_C=C_T$ is the total capacitance at the floating gate. Taking the difference between the above two equations:

$$C_T\frac{d}{dt}(W_S - W_R) + I_{FN}(W_S) - I_{FN}(W_R) = C_C\frac{d}{dt}(V_{SET} - V_{RESET})$$

For the differential architecture, $w=W_S-W_R$. Let $V_{train}=V_{SET}-V_{RESET}$, the training voltage calculated by the training algorithm. In addition, $I_{FN}$ is substituted. Let $C_C/C_T=C_R$, the input coupling ratio:

$$\frac{dw}{dt} = -\frac{(I_{FN}(W_S) - I_{FN}(W_R))}{C_T} + C_R\frac{d}{dt}(V_{train})$$

$$\frac{dw}{dt} = \frac{-\left(\frac{k_s}{k_2}\right)W_R^2\exp\left(-\frac{k_2}{W_R}\right) + \left(\frac{k_s}{k_2}\right)W_S^2\exp\left(-\frac{k_2}{W_S}\right)}{W_R - W_S}w + C_R\frac{d}{dt}(V_{train})$$

Discretizing the update for a small time-interval $\Delta t$ $$w_{n+1} = w_n + \frac{-\left(\frac{k_1}{k_2}\right)W_R^2\exp\left(-\frac{k_2}{W_R}\right) + \left(\frac{k_3}{k_2}\right)W_S^2\exp\left(-\frac{k_2}{W_S}\right)}{W_R - W_S}w_n\Delta t + C_R\Delta V_{train,n}$$

Let $\mu=W_R/W_S$ $$w_{n+1} =$$

$$w_n - \left(\frac{k_1}{k_2}\right)W_S\exp\left(-\frac{k_2}{W_S}\right)\frac{\mu^2\exp\left(-\frac{k_2}{W_S}\left(1 - \frac{1}{\mu}\right)\right) - 1}{\mu - 1}w_n\Delta t + C_R\Delta V_{train,n}$$

Assuming that the stored weight (measured in mV) is much smaller than node potential (>6V) i.e., w<<WR (and $W_R \approx W_S$) and taking the limit ($\mu \rightarrow 1$) using L'Hôpital's rule:

$$w_{n+1} = \left(1 - \left(\frac{k_1}{k_2}\right)(2W_S + k_2)\exp\left(-\frac{k_2}{W_S}\right)\Delta t\right)w_n + C_R\Delta V_{train,n}$$

$W_S$ follows the temporal dynamics $$w_{n+1} = -k_S\left(\frac{2}{\log(k_1 n\Delta t + k_0)} + 1\right)\left(\frac{1}{k_1 n\Delta t + k_0}\right)w_n\Delta t + C_R\Delta V_{train,n}$$

The weight decay factor for FN-DAM system is given as:

$$\alpha\eta_n = k_S\left(\frac{2}{\log(k_1 n\Delta t + k_0)} + 1\right)\left(\frac{1}{k_1 n\Delta t + k_0}\right) \rightarrow O\left(\frac{1}{n}\right)$$

A hybrid hardware-software system was implemented to carry out an online machine learning task. The 5 physical weights ($\overline{w}=[w_1,w_2]$) stored in two FN-DAM devices were measured and used to classify points 6 from a labelled test data set in software. We sought to train a linear decision boundary of the form:

$$f(\overline{x},\overline{w})=x_2+w_1x_1+w_0$$

$\overline{x}=[x1,x2]$ are the features of the training set. For each point that was misclassified, the error in the classification was calculated and a gradient of the loss function with respect to the weights was calculated. Based on the gradient information, the weights were updated in hardware by application of SET and RESET pulses via a function generator. The states of the SET and RESET nodes were measured every 2 seconds and the weight of each memory 12 cell, i, was calculated as:

$$|w_i|=1000*(W_{R,i}-W_{S,i})$$

The factor of 1000 indicates that the weight is stored as the potential difference between the SET and RESET nodes as measured in mV. We followed a stochastic gradient descent method. We defined loss function as:

$$\mathcal{L}_n(\overline{w})=\text{ReLU}(1-y_nf(\overline{x_n},\overline{w}))$$

The gradient of the loss function was calculated as:

$$G_n(\overline{w}) = \frac{\partial \mathcal{L}_n(\overline{w})}{\partial \overline{w}}$$

The weights needed to be updated as $$w_{n+1}=w_n-\lambda_nG_n(\overline{w})$$

where $\lambda_n$ is the learning rate as set by the learning algorithm.

The gradient information is used to update FN-19 DAM by applying control pulses to SET/RESET nodes via a suitable mapping function T:

$$V_{train,n}=T(\lambda_nG_n(\overline{w}))$$

Positive weight updates were carried out by application of SET pulses and negative updates via RESET 1 pulses. The magnitude of the update was implemented by modulating the number of input pulses.

The methods discussed herein may include additional, less, or alternate actions, including those discussed elsewhere herein. The methods may be implemented via one or more local or remote devices. Additionally, the systems and devices discussed herein may include additional, less, or alternate functionality, including that discussed elsewhere herein.

As used herein, an element or step recited in the singular and preceded by the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An analog memory device comprising:
a first node comprising a first floating gate, a second floating gate, and a capacitor, where the first floating gate is connected to the second floating gate via the capacitor; and
a second node comprising a first floating gate, a second floating gate, and a capacitor, where the first floating gate is connected to the second floating gate via the capacitor, and the second node is connected to the first node, and wherein an analog state of the first node and an analog state of the second node continuously and synchronously decay with respect to time, wherein the first node and the second node are configured such that a charge applied the first or second floating gate of the first or second nodes modifies a shape of a barrier of the associated first or second floating gate to enable Fowler-Nordheim quantum tunneling of electrons through the barrier.

2. The analog memory device of claim 1, wherein the first node is operable for a SET operation and the second node is operable for a RESET operation.

3. The analog memory device of claim 1, wherein the first floating gates of the first and second nodes are tunneling gates and the second floating gates of the first and second nodes are readout gates.

4. The analog memory device of claim 1, wherein the charge is applied by a combination of tunneling and hot electron injection.

5. The analog memory device of claim 1, wherein the first node and the second node are configured such that application of a voltage difference between the first and second floating gates of the first node and the second node prevents hot electron injection onto the second floating gates of the first node and the second node during readout operation.

6. The analog memory device of claim 1, wherein the analog memory device is one memory device of a plurality of analog memory devices configured to implement machine learning or neural network training.

7. A memory array comprising a plurality of analog memory devices of claim 1.

8. An adaptive synaptic array comprising:
a plurality of analog memory devices driven by Fowler-Nordheim quantum tunneling, wherein each analog memory device of the plurality of the analog memory devices comprises:
a first node comprising a first floating gate, a second floating gate and a capacitor, where the first floating gate is connected to the second floating gate via the capacitor; and
a second node comprising a first floating gate, a second floating gate and a capacitor, where the first floating gate is connected to the second floating gate via the capacitor, and the second node is connected to the first node, and wherein an analog state of the first node and an analog state of the second node continuously and synchronously decay with respect to time, wherein the first node and the second node of each analog memory device are configured such that a charge applied the first or second floating gate of the first or second nodes modifies a shape of a barrier of the associated first or second floating gate to enable Fowler-Nordheim quantum tunneling of electrons through the barrier.

9. The adaptive synaptic array of claim 8, wherein the first node of each analog memory device is operable for a SET operation and the second node of each analog memory device is operable for a RESET operation.

10. The adaptive synaptic array of claim 8, wherein the first floating gates of the first and second nodes of each analog memory device are tunneling gates and the second floating gates of the first and second nodes are readout gates.

11. The adaptive synaptic array claim 8, wherein the charge is applied by a combination of tunneling and hot electron injection.

12. The adaptive synaptic array claim 8, wherein the first node and the second node of each analog memory device are configured such that application of a voltage difference between the first and second floating gates of the first node and the second node prevents hot electron injection onto the second floating gates of the first node and the second node during readout operation.

13. The adaptive synaptic array of claim 8, wherein the analog memory devices are configured to implement machine learning or neural network training.

14. A method of machine learning using an adaptive synaptic array comprising a plurality of analog memory devices, each analog memory device including a first node comprising a first floating gate, a second floating gate and a capacitor, where the first floating gate is connected to the second floating gate via the capacitor, and a second node comprising a first floating gate, a second floating gate and a capacitor, where the first floating gate is connected to the second floating gate via the capacitor, and the second node is connected to the first node, and wherein an analog state of the first node and an analog state of the second node continuously and synchronously decay with respect to time, and the first node and the second node of each analog memory device are configured such that a charge applied the first or second floating gate of the first or second nodes modifies a shape of a barrier of the associated first or second floating gate to enable Fowler-Nordheim quantum tunneling of electrons through the barrier the method comprising:

selecting a network to be trained, the selected network having a plurality of learnable parameters;

assigning each learnable parameter to a different analog memory device of the adaptive synaptic array;

storing a weight for each learnable parameter in its assigned analog memory device through application of a charge to one or both of the first and second nodes to modify the shape of the barrier of the associated first or second floating gate of the one or both of the first and second nodes; and updating the weight of each learnable parameter in its assigned memory device in each training iteration of the selected network.

15. The method of claim 14, further comprising:

allowing the updated weight of each learnable parameter stored in its assigned memory device to decay for a period of time; and mapping the decayed weights into the network.

16. The method of claim 14, further comprising repeating the updating, allowing, and mapping until a desired number of training iterations has been completed.

* * * * *